US009845153B2

(12) United States Patent
Sekelsky

(10) Patent No.: US 9,845,153 B2
(45) Date of Patent: Dec. 19, 2017

(54) IN-SITU POWER CHARGING

(71) Applicant: Lockheed Martin Corporation, Bethesda, MD (US)

(72) Inventor: Stephen M. Sekelsky, Princeton, NJ (US)

(73) Assignee: Lockheed Martin Corporation, Bethesda, MD (US)

(*) Notice: Subject to any disclaimer, the term of this patent is extended or adjusted under 35 U.S.C. 154(b) by 0 days.

(21) Appl. No.: 15/003,088

(22) Filed: Jan. 21, 2016

(65) Prior Publication Data

US 2016/0214714 A1    Jul. 28, 2016

Related U.S. Application Data

(60) Provisional application No. 62/109,006, filed on Jan. 28, 2015, provisional application No. 62/109,551, filed on Jan. 29, 2015.

(51) Int. Cl.
*B64C 39/02* (2006.01)
*H02J 7/02* (2016.01)
(Continued)

(52) U.S. Cl.
CPC .......... *B64C 39/024* (2013.01); *B60L 11/182* (2013.01); *B60L 11/1837* (2013.01);
(Continued)

(58) Field of Classification Search
CPC ............ B64C 39/024; B64C 2201/141; B64C 2201/146; B64C 2201/066;
(Continued)

(56) References Cited

U.S. PATENT DOCUMENTS 2,746,027 A    5/1956  Murray
3,359,812 A    12/1967 Everitt
(Continued)

FOREIGN PATENT DOCUMENTS

CN    105738845 A    7/2016
DE    69608006 T2    2/2001
(Continued)

OTHER PUBLICATIONS

Fallah et al., "Multi-sensor approach in vessel magnetic wake imaging," Wave Motion 51(1): 60-76 (Jan. 2014), retrieved from http://www.sciencedirect.com/science/article/pii/S0165212513001133 (Aug. 21, 2016), 17 pages.
(Continued)

*Primary Examiner* — Atul Trivedi
(74) *Attorney, Agent, or Firm* — Foley & Lardner LLP

(57) ABSTRACT

A device includes a propulsion unit configured to move the device and a steering unit configured to control the direction of the device. The device also includes a power unit configured to provide power to the propulsion unit and a charging unit configured to use an electric field to provide electrical power to the power unit. The device further includes a first magnetic sensor configured to determine a vector of one or more magnetic fields and a processor communicatively coupled to the propulsion unit, the steering unit, the power unit, and the magnetic sensor. The processor is configured to receive, from the magnetic sensor, a time-varying signal indicative of a magnetic field and determine, based on the time-varying signal, that the magnetic field is associated with an electrical power transmission line. The processor is further configured to cause the steering unit to direct the device toward the electrical power transmission line.

40 Claims, 5 Drawing Sheets

(51) Int. Cl.
*G05D 1/08* (2006.01)
*G01R 33/032* (2006.01)
*B60L 11/18* (2006.01)
*G05D 1/02* (2006.01)
*G05D 1/10* (2006.01)
*G01C 21/20* (2006.01)
*G01R 1/067* (2006.01)
*G01R 31/02* (2006.01)
*G01R 31/08* (2006.01)

(52) U.S. Cl.
CPC ......... *G01R 33/032* (2013.01); *G05D 1/0265* (2013.01); *G05D 1/101* (2013.01); *H02J 7/025* (2013.01); *B60L 2200/10* (2013.01); *B60L 2240/622* (2013.01); *B64C 2201/021* (2013.01); *B64C 2201/066* (2013.01); *B64C 2201/141* (2013.01); *B64C 2201/146* (2013.01); *G01C 21/20* (2013.01); *G01R 1/06705* (2013.01); *G01R 31/021* (2013.01); *G01R 31/085* (2013.01)

(58) Field of Classification Search
CPC .............. B64C 2201/021; G05D 1/101; G05D 1/0265; G01C 21/20; G01R 1/06705; G01R 31/021; G01R 31/085; G01R 33/032; B60L 11/1837; Y02T 90/16; Y02T 90/163; H02J 7/025
USPC ........................................................ 701/1, 3
See application file for complete search history.

(56) References Cited

U.S. PATENT DOCUMENTS

| | | | |
|---|---|---|---|
| 3,389,333 | A | 6/1968 | Wolff et al. |
| 3,490,032 | A | 1/1970 | Zurflueh |
| 3,514,723 | A | 5/1970 | Cutler |
| 3,518,531 | A | 6/1970 | Huggett |
| 3,745,452 | A | 7/1973 | Osburn et al. |
| 3,899,758 | A | 8/1975 | Maier et al. |
| 4,025,873 | A | 5/1977 | Chilluffo |
| 4,078,247 | A | 3/1978 | Albrecht |
| 4,084,215 | A | 4/1978 | Willenbrock |
| 4,322,769 | A | 3/1982 | Cooper |
| 4,329,173 | A | 5/1982 | Culling |
| 4,359,673 | A | 11/1982 | Bross et al. |
| 4,368,430 | A | 1/1983 | Dale et al. |
| 4,410,926 | A | 10/1983 | Hafner et al. |
| 4,437,533 | A | 3/1984 | Bierkarre et al. |
| 4,514,083 | A | 4/1985 | Fukuoka |
| 4,588,993 | A | 5/1986 | Babij et al. |
| 4,636,612 | A | 1/1987 | Cullen |
| 4,638,324 | A | 1/1987 | Hannan |
| 4,675,522 | A | 6/1987 | Arunkumar |
| 4,768,962 | A | 9/1988 | Kupfer et al. |
| 4,818,990 | A | 4/1989 | Fernandes |
| 4,820,986 | A | 4/1989 | Mansfield et al. |
| 4,945,305 | A | 7/1990 | Blood |
| 4,958,328 | A | 9/1990 | Stubblefield |
| 5,019,721 | A | 5/1991 | Martens et al. |
| 5,038,103 | A | 8/1991 | Scarzello et al. |
| 5,113,136 | A | 5/1992 | Hayashi et al. |
| 5,134,369 | A | 7/1992 | Lo et al. |
| 5,189,368 | A | 2/1993 | Chase |
| 5,200,855 | A | 4/1993 | Meredith et al. |
| 5,245,347 | A | 9/1993 | Bonta et al. |
| 5,252,912 | A | 10/1993 | Merritt et al. |
| 5,301,096 | A | 4/1994 | Klontz et al. |
| 5,384,109 | A | 1/1995 | Klaveness et al. |
| 5,396,802 | A | 3/1995 | Moss |
| 5,420,549 | A | 5/1995 | Prestage |
| 5,425,179 | A | 6/1995 | Nickel et al. |
| 5,427,915 | A | 6/1995 | Ribi et al. |
| 5,548,279 | A | 8/1996 | Gaines |
| 5,568,516 | A | 10/1996 | Strohallen et al. |
| 5,586,069 | A | 12/1996 | Dockser |
| 5,597,762 | A | 1/1997 | Popovici et al. |
| 5,638,472 | A | 6/1997 | Van Delden |
| 5,694,375 | A | 12/1997 | Woodall |
| 5,719,497 | A | 2/1998 | Veeser et al. |
| 5,731,996 | A | 3/1998 | Gilbert |
| 5,764,061 | A | 6/1998 | Asakawa et al. |
| 5,818,352 | A | 10/1998 | McClure |
| 5,846,708 | A | 12/1998 | Hollis et al. |
| 5,888,925 | A | 3/1999 | Smith et al. |
| 5,907,420 | A | 5/1999 | Chraplyvy et al. |
| 5,907,907 | A | 6/1999 | Ohtomo et al. |
| 6,042,249 | A | 3/2000 | Spangenberg |
| 6,057,684 | A | 5/2000 | Murakami et al. |
| 6,124,862 | A | 9/2000 | Boyken et al. |
| 6,130,753 | A | 10/2000 | Hopkins et al. |
| 6,144,204 | A | 11/2000 | Sementchenko |
| 6,195,231 | B1 | 2/2001 | Sedlmayr et al. |
| 6,360,173 | B1 | 3/2002 | Fullerton |
| 6,398,155 | B1 | 6/2002 | Hepner et al. |
| 6,433,944 | B1 | 8/2002 | Nagao et al. |
| 6,472,651 | B1 | 10/2002 | Ukai |
| 6,472,869 | B1 | 10/2002 | Upschulte et al. |
| 6,504,365 | B2 | 1/2003 | Kitamura |
| 6,542,242 | B1 | 4/2003 | Yost et al. |
| 6,621,578 | B1 | 9/2003 | Mizoguchi |
| 6,636,146 | B1 | 10/2003 | Wehoski |
| 6,686,696 | B2 | 2/2004 | Mearini et al. |
| 6,690,162 | B1 | 2/2004 | Schopohl et al. |
| 6,765,487 | B1 | 7/2004 | Holmes et al. |
| 6,788,722 | B1 | 9/2004 | Kennedy et al. |
| 6,809,829 | B1 | 10/2004 | Takata et al. |
| 7,118,657 | B2 | 10/2006 | Golovchenko et al. |
| 7,221,164 | B1 | 5/2007 | Barringer |
| 7,277,161 | B2 | 10/2007 | Claus |
| 7,305,869 | B1 | 12/2007 | Berman et al. |
| 7,307,416 | B2 | 12/2007 | Islam et al. |
| RE40,343 | E | 5/2008 | Anderson |
| 7,413,011 | B1 | 8/2008 | Chee et al. |
| 7,427,525 | B2 | 9/2008 | Santori et al. |
| 7,448,548 | B1 | 11/2008 | Compton |
| 7,471,805 | B2 | 12/2008 | Goldberg |
| 7,474,090 | B2 | 1/2009 | Islam et al. |
| 7,543,780 | B1 * | 6/2009 | Marshall ............... B64C 39/024 244/110 G |
| 7,546,000 | B2 | 6/2009 | Spillane et al. |
| 7,570,050 | B2 | 8/2009 | Sugiura |
| 7,608,820 | B1 | 10/2009 | Berman et al. |
| 7,705,599 | B2 | 4/2010 | Strack et al. |
| 7,805,030 | B2 | 9/2010 | Bratkovski et al. |
| 7,916,489 | B2 | 3/2011 | Okuya |
| 7,983,812 | B2 | 7/2011 | Potter |
| 8,022,693 | B2 | 9/2011 | Meyersweissflog |
| 8,120,351 | B2 | 2/2012 | Rettig et al. |
| 8,120,355 | B1 | 2/2012 | Stetson |
| 8,138,756 | B2 | 3/2012 | Barclay et al. |
| 8,193,808 | B2 | 6/2012 | Fu et al. |
| 8,294,306 | B2 | 10/2012 | Kumar et al. |
| 8,311,767 | B1 | 11/2012 | Stetson |
| 8,334,690 | B2 | 12/2012 | Kitching et al. |
| 8,415,640 | B2 | 4/2013 | Babinec et al. |
| 8,471,137 | B2 | 6/2013 | Adair et al. |
| 8,480,653 | B2 | 7/2013 | Birchard et al. |
| 8,525,516 | B2 | 9/2013 | Le Prado et al. |
| 8,547,090 | B2 | 10/2013 | Lukin et al. |
| 8,574,536 | B2 | 11/2013 | Boudou et al. |
| 8,575,929 | B1 | 11/2013 | Wiegert |
| 8,686,377 | B2 | 4/2014 | Twitchen et al. |
| 8,758,509 | B2 | 6/2014 | Twitchen et al. |
| 8,803,513 | B2 | 8/2014 | Hosek et al. |
| 8,885,301 | B1 | 11/2014 | Heidmann |
| 8,913,900 | B2 | 12/2014 | Lukin et al. |
| 8,933,594 | B2 * | 1/2015 | Kurs ....................... B60L 3/003 307/104 |
| 8,947,080 | B2 | 2/2015 | Lukin et al. |
| 8,963,488 | B2 * | 2/2015 | Campanella ............ H02J 5/005 320/108 |
| 9,103,873 | B1 | 8/2015 | Martens et al. |

(56) References Cited

U.S. PATENT DOCUMENTS

| | | |
|---|---|---|
| 9,157,859 B2 | 10/2015 | Walsworth et al. |
| 9,245,551 B2 | 1/2016 | El Hallak et al. |
| 9,249,526 B2 | 2/2016 | Twitchen et al. |
| 9,291,508 B1 | 3/2016 | Biedermann et al. |
| 9,369,182 B2* | 6/2016 | Kurs ............... H01Q 1/248 |
| 9,541,610 B2 | 1/2017 | Kaup et al. |
| 9,551,763 B1 | 1/2017 | Hahn et al. |
| 9,557,391 B2 | 1/2017 | Egan et al. |
| 9,570,793 B2 | 2/2017 | Borodulin |
| 9,590,601 B2 | 3/2017 | Krause et al. |
| 9,614,589 B1 | 4/2017 | Russo et al. |
| 9,680,338 B2* | 6/2017 | Malpas ............... A61B 5/0002 |
| 9,689,679 B2 | 6/2017 | Budker et al. |
| 9,720,055 B1 | 8/2017 | Hahn et al. |
| 2002/0144093 A1 | 10/2002 | Inoue et al. |
| 2002/0167306 A1 | 11/2002 | Zalunardo et al. |
| 2003/0058346 A1 | 3/2003 | Bechtel et al. |
| 2003/0076229 A1 | 4/2003 | Blanpain et al. |
| 2003/0098455 A1 | 5/2003 | Amin et al. |
| 2003/0235136 A1 | 12/2003 | Akselrod et al. |
| 2004/0013180 A1 | 1/2004 | Giannakis et al. |
| 2004/0022179 A1 | 2/2004 | Giannakis et al. |
| 2004/0042150 A1 | 3/2004 | Swinbanks et al. |
| 2004/0081033 A1 | 4/2004 | Arieli et al. |
| 2004/0109328 A1 | 6/2004 | Dahl et al. |
| 2004/0247145 A1 | 12/2004 | Luo et al. |
| 2005/0031840 A1 | 2/2005 | Swift et al. |
| 2005/0068249 A1 | 3/2005 | Frederick du Toit et al. |
| 2005/0099177 A1 | 5/2005 | Greelish |
| 2005/0112594 A1 | 5/2005 | Grossman |
| 2005/0126905 A1 | 6/2005 | Golovchenko et al. |
| 2005/0130601 A1 | 6/2005 | Palermo et al. |
| 2005/0134257 A1 | 6/2005 | Etherington et al. |
| 2005/0138330 A1 | 6/2005 | Owens et al. |
| 2005/0146327 A1 | 7/2005 | Jakab |
| 2006/0012385 A1 | 1/2006 | Tsao et al. |
| 2006/0054789 A1 | 3/2006 | Miyamoto et al. |
| 2006/0055584 A1 | 3/2006 | Waite et al. |
| 2006/0062084 A1 | 3/2006 | Drew |
| 2006/0071709 A1 | 4/2006 | Maloberti et al. |
| 2006/0247847 A1 | 11/2006 | Carter et al. |
| 2006/0255801 A1 | 11/2006 | Ikeda |
| 2006/0291771 A1 | 12/2006 | Braunisch et al. |
| 2007/0004371 A1 | 1/2007 | Okanobu |
| 2007/0247147 A1 | 10/2007 | Xiang et al. |
| 2007/0273877 A1 | 11/2007 | Kawano et al. |
| 2008/0016677 A1 | 1/2008 | Creighton, IV |
| 2008/0048640 A1 | 2/2008 | Hull et al. |
| 2008/0078233 A1 | 4/2008 | Larson et al. |
| 2008/0089367 A1 | 4/2008 | Srinivasan et al. |
| 2008/0204004 A1 | 8/2008 | Anderson |
| 2008/0217516 A1 | 9/2008 | Suzuki et al. |
| 2008/0239265 A1 | 10/2008 | Den Boef |
| 2008/0253264 A1 | 10/2008 | Nagatomi et al. |
| 2008/0266050 A1 | 10/2008 | Crouse et al. |
| 2008/0299904 A1 | 12/2008 | Yi et al. |
| 2009/0042592 A1 | 2/2009 | Cho et al. |
| 2009/0058697 A1 | 3/2009 | Aas et al. |
| 2009/0060790 A1 | 3/2009 | Okaguchi et al. |
| 2009/0079417 A1* | 3/2009 | Mort ............... G01R 15/14 324/111 |
| 2009/0079426 A1 | 3/2009 | Anderson |
| 2009/0132100 A1 | 5/2009 | Shibata |
| 2009/0157331 A1 | 6/2009 | Van Netten |
| 2009/0195244 A1 | 8/2009 | Mouget et al. |
| 2009/0222208 A1 | 9/2009 | Speck |
| 2009/0277702 A1 | 11/2009 | Kanada et al. |
| 2009/0310650 A1 | 12/2009 | Chester et al. |
| 2010/0004802 A1 | 1/2010 | Bodin et al. |
| 2010/0015438 A1 | 1/2010 | Williams et al. |
| 2010/0015918 A1* | 1/2010 | Liu ............... H04B 5/00 455/41.1 |
| 2010/0045269 A1 | 2/2010 | Lafranchise et al. |
| 2010/0071904 A1 | 3/2010 | Burns et al. |
| 2010/0102809 A1 | 4/2010 | May |
| 2010/0134922 A1 | 6/2010 | Yamada et al. |
| 2010/0157305 A1 | 6/2010 | Henderson |
| 2010/0188081 A1 | 7/2010 | Lammegger |
| 2010/0237149 A1 | 9/2010 | Olmstead |
| 2010/0271016 A1 | 10/2010 | Barclay et al. |
| 2010/0277121 A1* | 11/2010 | Hall ............... B60L 11/182 320/108 |
| 2010/0308813 A1 | 12/2010 | Lukin et al. |
| 2010/0315079 A1 | 12/2010 | Lukin et al. |
| 2010/0326042 A1 | 12/2010 | McLean et al. |
| 2011/0034393 A1 | 2/2011 | Justen et al. |
| 2011/0059704 A1 | 3/2011 | Norimatsu et al. |
| 2011/0062957 A1 | 3/2011 | Fu et al. |
| 2011/0063957 A1 | 3/2011 | Isshiki et al. |
| 2011/0066379 A1 | 3/2011 | Mes |
| 2011/0120890 A1 | 5/2011 | Macpherson et al. |
| 2011/0127999 A1 | 6/2011 | Lott et al. |
| 2011/0165862 A1 | 7/2011 | Yu et al. |
| 2011/0176563 A1 | 7/2011 | Friel et al. |
| 2011/0243267 A1 | 10/2011 | Won et al. |
| 2011/0270078 A1 | 11/2011 | Wagenaar et al. |
| 2012/0016538 A1 | 1/2012 | Waite et al. |
| 2012/0019242 A1 | 1/2012 | Hollenberg et al. |
| 2012/0037803 A1 | 2/2012 | Strickland |
| 2012/0044014 A1 | 2/2012 | Stratakos et al. |
| 2012/0051996 A1 | 3/2012 | Scarsbrook et al. |
| 2012/0063505 A1 | 3/2012 | Okamura et al. |
| 2012/0087449 A1 | 4/2012 | Ling et al. |
| 2012/0089299 A1* | 4/2012 | Breed ............... B60C 11/24 701/36 |
| 2012/0140219 A1 | 6/2012 | Cleary |
| 2012/0181020 A1 | 7/2012 | Barron et al. |
| 2012/0194068 A1 | 8/2012 | Cheng et al. |
| 2012/0203086 A1 | 8/2012 | Rorabaugh et al. |
| 2012/0232388 A1 | 9/2012 | Kemppi et al. |
| 2012/0235633 A1* | 9/2012 | Kesler ............... H03H 7/40 320/108 |
| 2012/0235634 A1* | 9/2012 | Hall ............... H03H 7/40 320/108 |
| 2012/0245885 A1 | 9/2012 | Kimishima |
| 2012/0257683 A1 | 10/2012 | Schwager et al. |
| 2012/0281843 A1 | 11/2012 | Christensen et al. |
| 2012/0326793 A1 | 12/2012 | Gan |
| 2013/0043863 A1 | 2/2013 | Ausserlechner et al. |
| 2013/0093424 A1 | 4/2013 | Blank et al. |
| 2013/0127518 A1 | 5/2013 | Nakao |
| 2013/0179074 A1 | 7/2013 | Haverinen |
| 2013/0215712 A1 | 8/2013 | Geiser et al. |
| 2013/0223805 A1 | 8/2013 | Ouyang et al. |
| 2013/0265782 A1 | 10/2013 | Barrena et al. |
| 2013/0270991 A1 | 10/2013 | Twitchen et al. |
| 2013/0279319 A1 | 10/2013 | Matozaki et al. |
| 2014/0012505 A1 | 1/2014 | Smith et al. |
| 2014/0037932 A1 | 2/2014 | Twitchen et al. |
| 2014/0044208 A1 | 2/2014 | Woodsum |
| 2014/0061510 A1 | 3/2014 | Twitchen et al. |
| 2014/0070622 A1* | 3/2014 | Keeling ............... H02J 50/50 307/104 |
| 2014/0072008 A1 | 3/2014 | Faraon et al. |
| 2014/0077231 A1 | 3/2014 | Twitchen et al. |
| 2014/0081592 A1 | 3/2014 | Bellusci et al. |
| 2014/0104008 A1 | 4/2014 | Gan |
| 2014/0126334 A1 | 5/2014 | Megdal et al. |
| 2014/0139322 A1 | 5/2014 | Wang et al. |
| 2014/0154792 A1 | 6/2014 | Moynihan et al. |
| 2014/0159652 A1* | 6/2014 | Hall ............... H02J 5/005 320/108 |
| 2014/0166904 A1 | 6/2014 | Walsworth et al. |
| 2014/0167759 A1 | 6/2014 | Pines et al. |
| 2014/0168174 A1 | 6/2014 | Idzik et al. |
| 2014/0180627 A1 | 6/2014 | Naguib et al. |
| 2014/0191139 A1 | 7/2014 | Englund |
| 2014/0191752 A1 | 7/2014 | Walsworth et al. |
| 2014/0198463 A1 | 7/2014 | Klein |
| 2014/0210473 A1 | 7/2014 | Campbell et al. |
| 2014/0215985 A1 | 8/2014 | Pollklas |
| 2014/0247094 A1 | 9/2014 | Englund et al. |
| 2014/0265555 A1* | 9/2014 | Hall ............... B60L 1/00 307/9.1 |

(56) References Cited

U.S. PATENT DOCUMENTS

| | | |
|---|---|---|
| 2014/0272119 A1 | 9/2014 | Kushalappa et al. |
| 2014/0273826 A1 | 9/2014 | Want et al. |
| 2014/0291490 A1 | 10/2014 | Hanson et al. |
| 2014/0297067 A1* | 10/2014 | Malay .................. G01C 9/005 701/4 |
| 2014/0306707 A1 | 10/2014 | Walsworth et al. |
| 2014/0327439 A1 | 11/2014 | Cappellaro et al. |
| 2014/0335339 A1 | 11/2014 | Dhillon et al. |
| 2014/0340085 A1 | 11/2014 | Cappellaro et al. |
| 2014/0368191 A1 | 12/2014 | Goroshevskiy et al. |
| 2015/0001422 A1 | 1/2015 | Englund et al. |
| 2015/0009746 A1 | 1/2015 | Kucsko et al. |
| 2015/0018018 A1 | 1/2015 | Shen et al. |
| 2015/0022404 A1 | 1/2015 | Chen et al. |
| 2015/0048822 A1 | 2/2015 | Walsworth et al. |
| 2015/0054355 A1 | 2/2015 | Ben-Shalom et al. |
| 2015/0061590 A1* | 3/2015 | Widmer ............. B60L 11/182 320/108 |
| 2015/0090033 A1 | 4/2015 | Budker et al. |
| 2015/0128431 A1 | 5/2015 | Kuo |
| 2015/0137793 A1 | 5/2015 | Englund et al. |
| 2015/0153151 A1 | 6/2015 | Kochanski |
| 2015/0192532 A1 | 7/2015 | Clevenson et al. |
| 2015/0192596 A1 | 7/2015 | Englund et al. |
| 2015/0225052 A1 | 8/2015 | Cordell |
| 2015/0235661 A1 | 8/2015 | Heidmann |
| 2015/0253355 A1 | 9/2015 | Grinolds et al. |
| 2015/0268373 A1 | 9/2015 | Meyer |
| 2015/0269957 A1 | 9/2015 | El Hallak et al. |
| 2015/0276897 A1 | 10/2015 | Leussler et al. |
| 2015/0299894 A1 | 10/2015 | Markham et al. |
| 2015/0303333 A1 | 10/2015 | Yu et al. |
| 2015/0314870 A1 | 11/2015 | Davies |
| 2015/0326030 A1* | 11/2015 | Malpas ................. H02J 5/005 307/104 |
| 2015/0326410 A1 | 11/2015 | Krause et al. |
| 2015/0374250 A1 | 12/2015 | Hatano et al. |
| 2015/0377865 A1 | 12/2015 | Acosta et al. |
| 2015/0377987 A1 | 12/2015 | Menon et al. |
| 2016/0031339 A1 | 2/2016 | Geo |
| 2016/0036529 A1 | 2/2016 | Griffith et al. |
| 2016/0071532 A9 | 3/2016 | Heidmann |
| 2016/0077167 A1 | 3/2016 | Heidmann |
| 2016/0097702 A1 | 4/2016 | Zhao et al. |
| 2016/0139048 A1 | 5/2016 | Heidmann |
| 2016/0146904 A1 | 5/2016 | Stetson et al. |
| 2016/0161429 A1 | 6/2016 | Englund et al. |
| 2016/0214714 A1 | 7/2016 | Sekelsky |
| 2016/0216304 A1 | 7/2016 | Sekelsky |
| 2016/0216340 A1 | 7/2016 | Egan et al. |
| 2016/0216341 A1* | 7/2016 | Boesch ............... G01R 33/032 |
| 2016/0221441 A1* | 8/2016 | Hall .......................... B60L 1/00 |
| 2016/0223621 A1 | 8/2016 | Kaup et al. |
| 2016/0231394 A1 | 8/2016 | Manickam et al. |
| 2016/0266220 A1 | 9/2016 | Sushkov et al. |
| 2016/0291191 A1 | 10/2016 | Fukushima et al. |
| 2016/0313408 A1 | 10/2016 | Hatano et al. |
| 2016/0348277 A1 | 12/2016 | Markham et al. |
| 2016/0356863 A1 | 12/2016 | Boesch et al. |
| 2017/0010214 A1 | 1/2017 | Osawa et al. |
| 2017/0010334 A1 | 1/2017 | Krause et al. |
| 2017/0010338 A1 | 1/2017 | Bayat et al. |
| 2017/0010594 A1 | 1/2017 | Kottapalli et al. |
| 2017/0023487 A1 | 1/2017 | Boesch |
| 2017/0068012 A1 | 3/2017 | Fisk |
| 2017/0104426 A1* | 4/2017 | Mills ..................... H02N 3/00 |
| 2017/0199156 A1 | 7/2017 | Villani et al. |
| 2017/0205526 A1 | 7/2017 | Meyer |
| 2017/0207823 A1 | 7/2017 | Russo et al. |
| 2017/0211947 A1 | 7/2017 | Fisk |
| 2017/0212046 A1 | 7/2017 | Cammerata |
| 2017/0212177 A1 | 7/2017 | Coar et al. |
| 2017/0212178 A1 | 7/2017 | Hahn et al. |
| 2017/0212179 A1 | 7/2017 | Hahn et al. |
| 2017/0212180 A1 | 7/2017 | Hahn et al. |
| 2017/0212181 A1 | 7/2017 | Coar et al. |
| 2017/0212182 A1 | 7/2017 | Hahn et al. |
| 2017/0212183 A1 | 7/2017 | Egan et al. |
| 2017/0212184 A1 | 7/2017 | Coar et al. |
| 2017/0212185 A1 | 7/2017 | Hahn et al. |
| 2017/0212186 A1 | 7/2017 | Hahn et al. |
| 2017/0212187 A1 | 7/2017 | Hahn et al. |
| 2017/0212190 A1 | 7/2017 | Reynolds et al. |
| 2017/0212258 A1 | 7/2017 | Fisk |

FOREIGN PATENT DOCUMENTS

| | | |
|---|---|---|
| DE | 19600241 C2 | 8/2002 |
| DE | 10228536 A1 | 1/2003 |
| EP | 0 161 940 B1 | 12/1990 |
| EP | 0 718 642 | 6/1996 |
| EP | 0 726 458 | 8/1996 |
| EP | 1 505 627 | 2/2005 |
| EP | 1 685 597 | 8/2006 |
| EP | 1 990 313 | 11/2008 |
| EP | 2 163 392 | 3/2010 |
| EP | 2 495 166 A1 | 9/2012 |
| EP | 2 587 232 A1 | 5/2013 |
| EP | 2 705 179 | 3/2014 |
| EP | 2 707 523 | 3/2014 |
| EP | 2 745 360 | 6/2014 |
| EP | 2 769 417 | 8/2014 |
| EP | 2 790 031 | 10/2014 |
| EP | 2 837 930 | 2/2015 |
| EP | 2 907 792 | 8/2015 |
| GB | 2 433 737 | 7/2007 |
| GB | 2423366 A | 8/2008 |
| GB | 2 482 596 | 2/2012 |
| GB | 2 483 767 | 3/2012 |
| GB | 2 486 794 | 6/2012 |
| GB | 2 490 589 | 11/2012 |
| GB | 2 491 936 | 12/2012 |
| GB | 2 493 236 | 1/2013 |
| GB | 2 495 632 A | 4/2013 |
| GB | 2 497 660 | 6/2013 |
| GB | 2 510 053 A | 7/2014 |
| GB | 2 515 226 | 12/2014 |
| GB | 2 522 309 | 7/2015 |
| GB | 2 526 639 | 12/2015 |
| JP | 3782147 B2 | 6/2006 |
| JP | 4800896 B2 | 10/2011 |
| JP | 2012-103171 | 5/2012 |
| JP | 2012-110489 | 6/2012 |
| JP | 2012-121748 | 6/2012 |
| JP | 2013-028497 | 2/2013 |
| JP | 5476206 B2 | 4/2014 |
| JP | 5522606 B2 | 6/2014 |
| JP | 5536056 B2 | 7/2014 |
| JP | 5601183 B2 | 10/2014 |
| JP | 2014-215985 | 11/2014 |
| JP | 2014-216596 | 11/2014 |
| JP | 2015-518562 A | 7/2015 |
| JP | 5764059 B2 | 8/2015 |
| JP | 2015-167176 | 9/2015 |
| JP | 2015-529328 | 10/2015 |
| JP | 5828036 B2 | 12/2015 |
| JP | 5831947 B2 | 12/2015 |
| WO | WO-87/04028 A1 | 7/1987 |
| WO | WO-88/04032 A1 | 6/1988 |
| WO | WO-95/33972 A1 | 12/1995 |
| WO | WO-2011/046403 A2 | 4/2011 |
| WO | WO-2011/153339 | 12/2011 |
| WO | WO-2012/016977 A2 | 2/2012 |
| WO | WO-2012/084750 | 6/2012 |
| WO | WO-2013/059404 A1 | 4/2013 |
| WO | WO-2013/066446 A1 | 5/2013 |
| WO | WO-2013/066448 | 5/2013 |
| WO | WO-2013/093136 A1 | 6/2013 |
| WO | WO-2013/188732 A1 | 12/2013 |
| WO | WO-2013/190329 A1 | 12/2013 |
| WO | WO-2014/011286 A2 | 1/2014 |
| WO | WO-2014/099110 A2 | 6/2014 |
| WO | WO-2014/135544 A1 | 9/2014 |
| WO | WO-2014/135547 A1 | 9/2014 |

(56) References Cited

FOREIGN PATENT DOCUMENTS

| | | |
|---|---|---|
| WO | WO-2014/166883 A1 | 10/2014 |
| WO | WO-2014/210486 A1 | 12/2014 |
| WO | WO-2015/015172 A1 | 2/2015 |
| WO | WO-2015/142945 | 9/2015 |
| WO | WO-2015/157110 | 10/2015 |
| WO | WO-2015/157290 | 10/2015 |
| WO | WO-2015/158383 A1 | 10/2015 |
| WO | WO-2015/193156 A1 | 12/2015 |
| WO | WO-2016/075226 A1 | 5/2016 |
| WO | WO-2016/118756 | 7/2016 |
| WO | WO-2016/118791 | 7/2016 |
| WO | WO-2016/122965 | 8/2016 |
| WO | WO-2016/122966 | 8/2016 |
| WO | WO-2016/126435 | 8/2016 |
| WO | WO-2016/126436 | 8/2016 |
| WO | WO-2016/190909 | 12/2016 |
| WO | WO-2017/007513 | 1/2017 |
| WO | WO-2017/007514 | 1/2017 |
| WO | WO-2017/014807 | 1/2017 |
| WO | PCT/US2017/021593 | 3/2017 |
| WO | PCT/US2017/021811 | 3/2017 |
| WO | PCT/US2017/022118 | 3/2017 |
| WO | PCT/US2017/022279 | 3/2017 |
| WO | PCT/US2017/024165 | 3/2017 |
| WO | PCT/US2017/024167 | 3/2017 |
| WO | PCT/US2017/024168 | 3/2017 |
| WO | PCT/US2017/024169 | 3/2017 |
| WO | PCT/US2017/024171 | 3/2017 |
| WO | PCT/US2017/024172 | 3/2017 |
| WO | PCT/US2017/024173 | 3/2017 |
| WO | PCT/US2017/024174 | 3/2017 |
| WO | PCT/US2017/024175 | 3/2017 |
| WO | PCT/US2017/024177 | 3/2017 |
| WO | PCT/US2017/024179 | 3/2017 |
| WO | PCT/US2017/024180 | 3/2017 |
| WO | PCT/US2017/024181 | 3/2017 |
| WO | PCT/US2017/024182 | 3/2017 |
| WO | WO-2017/039747 | 3/2017 |
| WO | WO-2017/095454 A1 | 6/2017 |
| WO | WO-2017/127079 A1 | 7/2017 |
| WO | WO-2017/127080 A1 | 7/2017 |
| WO | WO-2017/127081 A1 | 7/2017 |
| WO | WO-2017/127085 A1 | 7/2017 |
| WO | WO-2017/127090 A1 | 7/2017 |
| WO | WO-2017/127091 A1 | 7/2017 |
| WO | WO-2017/127093 A1 | 7/2017 |
| WO | WO-2017/127094 A1 | 7/2017 |
| WO | WO-2017/127095 A1 | 7/2017 |
| WO | WO-2017/127096 A1 | 7/2017 |
| WO | WO-2017/127097 A1 | 7/2017 |
| WO | WO-2017/127098 A1 | 7/2017 |

OTHER PUBLICATIONS

International Preliminary Report on Patentability dated Oct. 20, 2016 from related PCT application PCT/US2015/024723, 7 pages.
International Search Report and Written Opinion of the International Searching Authority dated Sep. 13, 2016 from related PCT application PCT/US16/14377, 11 pages.
Notice of Allowance dated Aug. 17, 2016, from related U.S. Appl. No. 15/003,718, 8 pages.
Notice of Allowance dated Sep. 8, 2016, from related patent U.S. Appl. No. 15/003,298, 10 pages.
Soykal et al., "Quantum metrology with a single spin-3/2 defect in silicon carbide," Mesoscale and Nanoscale Physics (May 24, 2016), retrieved from https://arxiv.org/abs/1605.07628 (Sep. 22, 2016), 9 pages.
Teale, "Magnetometry with Ensembles of Nitrogen Vacancy Centers in Bulk Diamond," Master's Thesis, Massachusetts Institute of Technology Department of Electrical Engineering and Computer Science (Sep. 2015), 57 pages.
U.S. Office Action dated Aug. 24, 2016 from related patent U.S. Appl. No. 14/676,740, 19 pages.
U.S. Office Action dated Oct. 14, 2016 from related U.S. Appl. No. 15/003,677, 13 pages.
U.S. Office Action dated Oct. 19, 2016 from related U.S. Appl. No. 15/218,821, 6 pages.
U.S. Office Action dated Nov. 2, 2016 from related patent U.S. Appl. No. 15/003,256, 19 pages.
U.S. Office Action dated Nov. 3, 2016 from related patent U.S. Appl. No. 15/204,675, 9 pages.
Widmann et al., "Coherent control of single spins in silicon carbide at room temperature," Nature Materials, 14: 164-168 (Feb. 2015) (available online Dec. 1, 2014), 5 pages.
"'Diamond Sensors, Detectors, and Quantum Devices' in Patent Application Approval Process," Chemicals & Chemistry (Feb. 28, 2014).
"Findings from University of Stuttgart in physics reported," Physics Week (Jul. 7, 2009).
"New Findings on Nitrogen from Ecole Normale Superieure Summarized (Magnetic imaging with an ensemble of nitrogen vacancy-centers in diamond)," Physics Week (Jul. 21, 2015).
"Patent Issued for Diamond Sensors, Detectors, and Quantum Devices (U.S. Pat. No. 9,249,526)," Journal of Engineering (Feb. 15, 2016).
"Researchers Submit Patent Application, 'Diamond Sensors, Detectors, and Quantum Devices', for Approval," Chemicals & Chemistry (Apr. 11, 2014).
Acosta, "Optical Magnetometry with Nitrogen-Vacancy Centers in Diamond," University of California Berkeley, 2011.
Acosta, et al., "Diamonds with a high density of nitrogen—vacancy centers for magnetometry applications," Physical Review B, Sep. 2009.
Acosta, et al., "Nitrogen-vacancy centers: physics and applications," MRS Bulletin, 2013.
Aiello, et al., "Composite-pulse magnetometry with a solid-state quantum sensor," Nature Communications, Jan. 2013.
Alam, "Solid-state C-13 magic angle spinning NMR spectroscopy characterization of particle size structural variations in synthetic nanodiamonds," Materials Chemistry and Physics, Jun. 2004.
Albrecht, et al., "Coupling of nitrogen vacancy centres in nanodiamonds by means of phonons," New Journal of Physics, Aug. 2013.
Anthony, et al., "Jahn-Teller Splitting and Zeeman Effect of Acceptors in Diamond," 20th International Conference on Defects in Semiconductors, Jul. 1999.
Appel, et al., "Nanoscale microwave imaging with a single electron spin in diamond," New Journal of Physics, Nov. 2015.
Arai, et al., "Fourier magnetic imaging with nanoscale resolution and compressed sensing speed-up using electronic spins in diamond," Nature Nanotechnology, Oct. 2015.
Aslam, et al., "Single spin optically detected magnetic resonance with 60-90 GHz (E-band) microwave resonators," Review of Scientific Instruments, Jun. 2015.
Awschalom, et al., "Diamond age of spintronics," Scientific American, Oct. 2007.
Babamoradi, et al., "Correlation between entanglement and spin density in nitrogen-vacancy center of diamond," European Physical Journal D, Dec. 2011.
Babunts, et al., "Diagnostics of NV defect structure orientation in diamond using optically detected magnetic resonance with a modulated magnetic field," Technical Physics Letters, Jun. 2015.
Babunts, et al., "Temperature-scanned magnetic resonance and the evidence of two-way transfer of a nitrogen nuclear spin hyperfine interaction in coupled NV-N pairs in diamond," JETP Letters, Jun. 2012.
Bagguley, et al., "Zeeman effect of acceptor states in semiconducting diamond," Journal of the Physical Society of Japan, 1966.
Balasubramanian, et al., "Nanoscale imaging magnetometry with diamond spins under ambient conditions," Nature, Oct. 2008.
Balmer, et al., "Chemical Vapour deposition synthetic diamond: materials technology and applications," J. of Physics, 2009.
Baranov, et al., "Enormously High Concentrations of Fluorescent Nitrogen-Vacancy Centers Fabricated by Sintering of Detonation Nanodiamonds," Small, Jun. 2011.

(56) References Cited

OTHER PUBLICATIONS

Barfuss, et al., "Strong mechanical driving of a single electron spin," Nature Physics, Oct. 2015.
Bennett, et al., "CVD Diamond for High Power Laser Applications," Proceedings of SPIE, Jan. 2013.
Berman & Chernobrod, "Single-spin microscope with sub-nanoscale resolution based on optically detected magnetic resonance," Proceedings of SPIE, May 2010.
Berman, et al. "Measurement of single electron and nuclear spin states based on optically detected magnetic resonance," J. Physics: Conf. Series 38: 167-170 (2006).
Blakley, et al., "Room-temperature magnetic gradiometry with fiber-coupled nitrogen—vacancy centers in diamond," Optics Letters, Aug. 2015.
Bourgeois, et al., "Photoelectric detection of electron spin resonance of nitrogen-vacancy centres in diamond," Nature Communications, Oct. 2015.
Budker & Kimball, "Optical Magnetometry," Cambridge Press, 2013.
Budker & Romalis, "Optical Magnetometry," Nature Physics, 2007.
Casanova, et al., "Effect of magnetic field on phosphorus centre in diamond," Physica Status Solidi A, Jul. 2001.
Castelletto, et al., "Frontiers in diffraction unlimited optical methods for spin manipulation, magnetic field sensing and imaging using diamond nitrogen vacancy defects," Nanophotonics, 2012.
Chapman, et al., "Anomalous saturation effects due to optical spin depolarization in nitrogen-vacancy centers in diamond nanocrystals," Physical Review B, Jul. 2012.
Chen, et al., "Vector magnetic field sensing by a single nitrogen vacancy center in diamond," EPL, Mar. 2013.
Chernobrod, et al., "Improving the sensitivity of frequency modulation spectroscopy using nanomechanical cantilevers," Applied Physics Letters, 2004.
Chernobrod, et al., "Spin Microscope Based on Optically Detected Magnetic Resonance," Journal of Applied Physics, 2005.
Childress, et al., "Coherent dynamics of coupled electron and nuclear spin qubits in diamond," Science, 2006.
Chipaux, et al., "Magnetic imaging with an ensemble of nitrogen vacancy-centers in diamond," European Physical Journal D, Jul. 2015.
Chipaux, et al., "Nitrogen vacancies (NV) centers in diamond for magnetic sensors and quantum sensing," Proceedings of SPIE, Jan. 2015.
Chipaux, et al., "Wide bandwidth instantaneous radio frequency spectrum analyzer based on nitrogen vacancy centers in diamond," Applied Physics Letters, Dec. 2015.
Clevenson, et al., "Broadband magnetometry and temperature sensing with a light-trapping diamond waveguide," Nature Physics, May 2015.
Cooper, et al., "Time-resolved magnetic sensing with electronic spins in diamond," Nature Communications, Jan. 2014.
Creedon, et al., "Strong coupling between P1 diamond impurity centers and a three-dimensional lumped photonic microwave cavity," Physical Review B, Apr. 2015.
Davies, "Current problems in diamond: towards a quantitative understanding," Physica B—Condensed Matter, Dec. 1999.
De Lange, et al., "Single-Spin Magnetometry with Multipulse Sensing Sequences," Physical Review Letters, Feb. 2011.
Degen, "Scanning magnetic field microscope with a diamond single-spin sensor ," Applied Physics Letters, 2008.
Delacroix, et al., "Design, manufacturing, and performance analysis of mid-infrared achromatic half-wave plates with diamond subwavelength gratings," Applied Optics, 2012.
Denatale, et al., "Fabrication and characterization of diamond moth eye antireflective surfaces on Ge," J. of Applied Physics, 1982.
Dobrovitski, et al., "Quantum Control over Single Spins in Diamond," Annual Review of Condensed Matter Physics vol. 4, 2013.
Doherty, et al., "The nitrogen-vacancy colour centre in diamond," Physics Reports, Jul. 2013.

Doherty, et al., "Theory of the ground-state spin of the NV-center in diamond," Physical Review B, May 2012.
Doi, et al., "Pure negatively charged state of the NV center in n-type diamond," Physical Review B, Feb. 2016.
Drake, et al., "Influence of magnetic field alignment and defect concentration on nitrogen-vacancy polarization in diamond," New Journal of Physics, Jan. 2016.
Dreau, et al., "Avoiding power broadening in optically detected magnetic resonance of single NV defects for enhanced dc magnetic field sensitivity," Physical Review B, Nov. 2011.
Dreau, et al., "High-resolution spectroscopy of single NV defects coupled with nearby C-13 nuclear spins in diamond," Physical Review B, Apr. 2012.
Dumeige, et al., "Magnetometry with nitrogen-vacancy ensembles in diamond based on infrared absorption in a doubly resonant optical cavity," Physical Review B, Apr. 2013.
Epstein, et al., "Anisotropic interactions of a single spin and dark-spin spectroscopy in diamond," Center for Spintronics and Quantum Computation, 2005.
Fedotov, et al., "High-resolution magnetic field imaging with a nitrogen-vacancy diamond sensor integrated with a photonic-crystal fiber," Optics Letters, Feb. 2016.
Fedotov, et al., "Photonic-crystal-fiber-coupled photoluminescence interrogation of nitrogen vacancies in diamond nanoparticles," Laser Physics Letters, Feb. 2012.
Feng & Wei, "A steady-state spectral method to fit microwave absorptions of NV centers in diamonds: application to sensitive magnetic field sensing," Measurement Science & Technology, Oct. 2014.
Freitas, et al., "Solid-State Nuclear Magnetic Resonance (NMR) Methods Applied to the Study of Carbon Materials," Chemistry and Physics of Carbon, vol. 31, 2012.
Geiselmann, et al., "Fast optical modulation of the fluorescence from a single nitrogen-vacancy centre," Nature Physics, Dec. 2013.
Gombert & Blasi, "The Moth-Eye Effect-From Fundamentals to Commercial Exploitation," Functional Properties of Bio-Inspired Surfaces, Nov. 2009.
Gong, et al., "Generation of Nitrogen-Vacancy Center Pairs in Bulk Diamond by Molecular Nitrogen Implantation," Chinese Physics Letters, Feb. 2016.
Gould, et al., "An imaging magnetometer for bio-sensing based on nitrogen-vacancy centers in diamond," Proceedings of the SPIE—Progress in Biomedical Optics and Imaging, 2014.
Gould, et al., "Room-temperature detection of a single 19 nm super-paramagnetic nanoparticle with an imaging magnetometer," Applied Physics Letters, Aug. 2014.
Gruber, et al., "Scanning confocal optical microscopy and magnetic resonance on single defect centers," Science, Jun. 1997.
Haeberle, et al., "Nanoscale nuclear magnetic imaging with chemical contrast," Nature Nanotechnology, Feb. 2015.
Haihua, et al., "Design of wideband anti-reflective sub wavelength nanostructures," Infrared and Laser Engineering, 2011.
Hall, et al., "Sensing of Fluctuating Nanoscale Magnetic Fields Using Nitrogen-Vacancy Centers in Diamond," Physical Review Letters, Nov. 2009.
Hanson, et al., "Coherent Dynamics of a single spin interacting with an adjustable spin bath," Sci. Am. Ass'n for the Advancement of Science, 2008.
Hanson, et al., "Polarization and Readout of Coupled Single Spins in Diamond," Physical Review Letters, 2006.
Hanson, et al., "Room-temperature manipulation and decoherence of a single spin in diamond," Physical Review, 2006.
Hanzawa, et al., "Zeeman effect on the zero-phonon line of the NV center in synthetic diamond," Physica B, Feb. 1993.
Hegyi & Yablonovitch, "Molecular imaging by optically detected electron spin resonance of nitrogen-vacancies in nanodiamonds," Nano Letters, Mar. 2013.
Hegyi & Yablonovitch, "Nanodiamond molecular imaging with enhanced contrast and expanded field of view," Journal of Biomedical Optics, Jan. 2014.
Hilser, et al., "All-optical control of the spin state in the NV-center in diamond," Physical Review B, Sep. 2012.

(56) References Cited

OTHER PUBLICATIONS

Hobbs, "Study of the Environmental and Optical Durability of AR Microstructures in Sapphire, ALON, and Diamond," Proceedings of SPIE, 2009.
Huebener, et al., "ODMR of NV centers in nano-diamonds covered with N@C60," Physica Status Solidi B, Oct. 2008.
Huxter, et al., "Vibrational and electronic dynamics of nitrogen-vacancy centres in diamond revealed by two-dimensional ultrafast spectroscopy," Nature Physics, Nov. 2013.
Ivady, et al., "Pressure and temperature dependence of the zero-field splitting in the ground state of NV centers in diamond: A first-principles study," Physical Review B, Dec. 2014.
Jarmola, et al., "Temperature- and Magnetic-Field-Dependent Longitudinal Spin Relaxation in Nitrogen-Vacancy Ensembles in Diamond," Physical Review Letters, May 2012.
Jensen, et al., "Light narrowing of magnetic resonances in ensembles of nitrogen-vacancy centers in diamond," Physical Review, Jan. 2013.
Kailath, "Linear Systems," Prentice Hall, 1979.
Karlsson, et al., "Diamond micro-optics: microlenses and antireflection structures surfaces for the infrared spectral region," Optics Express, 2003.
Khan & Hemmer, "Noise limitation in nano-scale imaging," Proceedings of SPIE, Dec. 2005.
Kim, et al., "Electron spin resonance shift and linewidth broadening of nitrogen-vacancy centers in diamond as a function of electron irradiation dose," Applied Physics Letters, Aug. 2012.
Kim, et al., "Magnetospectroscopy of acceptors in 'blue' diamonds," Physica B, Aug. 2001.
Kim, et al., "Zeeman effect of electronic Raman lines of accepters in elemental semiconductors: Boron in blue diamond," Physical Review B, Sep. 2000.
King, et al., "Optical polarization of 13C nuclei in diamond through nitrogen vacancy centers," Physical Review B, Feb. 2010.
Kok, et al., "Materials Science: Qubits in the pink," Nature, 2006.
Konenko, et al., "Formation of antireflective surface structures on diamond films by laser patterning," Applied Physics A, 1999.
Kraus, et al., "Magnetic field and temperature sensing with atomic-scale spin defects in silicon carbide," Scientific Reports, Jul. 2014.
Lai, et al., "Influence of a static magnetic field on the photoluminescence of an ensemble of nitrogen-vacancy color centers in a diamond single-crystal," Applied Physics Letters, Sep. 2009.
Lai, et al., "Optically detected magnetic resonance of a single Nitrogen-Vacancy electronic spin in diamond nanocrystals," CLEO/EQEC, 2009.
Laraoui, et al., "Nitrogen-vacancy-assisted magnetometry of paramagnetic centers in an individual diamond nanocrystal," Nano Letters, Jul. 2012.
Lazariev, et al., "A nitrogen-vacancy spin based molecular structure microscope using multiplexed projection reconstruction," Scientific Reports, Sep. 2015.
Lee, et al., "Vector magnetometry based on S=3/2 electronic spins," Physical Review B, Sep. 2015.
Lesik, et al., "Preferential orientation of NV defects in CVD diamond films grown on (113)-oriented substrates," Diamond and Related Materials, Jun. 2015.
Levchenko, et al., "Inhomogeneous broadening of optically detected magnetic resonance of the ensembles of nitrogen-vacancy centers in diamond by interstitial carbon atoms," Applied Physics Letters, Mar. 2015.
Liu, et al., "Electron spin studies of nitrogen vacancy centers in nanodiamonds," Acta Physica Sinica, Aug. 2013.
Liu, et al., "Fiber-integrated diamond-based magnetometer," Applied Physics Letters, Sep. 2013.
Maclaurin, et al., "Nanoscale magnetometry through quantum control of nitrogen-vacancy centres in rotationally diffusing nanodiamonds," New Journal of Physics, Jan. 2013.
Macs, et al., "Diamond as a magnetic field calibration probe," Journal of Physics D: Applied Physics, Apr. 2004.
Maletinsky, et al., "A robust scanning diamond sensor for nanoscale imaging with single nitrogen-vacancy centres," Nature Nanotechnology, May 2012.
Mamin, et al., "Multipulse Double-Quantum Magnetometry with Near-Surface Nitrogen-Vacancy Centers," Physical Review Letters, Jul. 2014.
Mamin, et al., "Nanoscale Nuclear Magnetic Resonance with a Nitrogen-Vacancy Spin Sensor," Science, Feb. 2013.
Manson, et al., "GR transitions in diamond: magnetic field measurements," Journal of Physics C, Nov. 1980.
Massachusetts Institute of Technology; "Wide-Field Imaging Using Nitrogen Vacancies" in Patent Application Approval Process, Physics Week (2015).
Matsuda, et al., "Development of a plastic diamond anvil cell for high pressure magneto-photoluminescence in pulsed high magnetic fields," International Journal of Modern Physics B, Nov. 2004.
Maze et al., "Nanoscale magnetic sensing with an individual electronic spin in diamond," Nature Physics (2008).
Maze, et al., "Nanoscale magnetic sensing using spin qubits in diamond," Nature Physics, 2009.
Meijer, et al., "Generation of single color centers by focused nitrogen implantation," Applied Physics Letters, Dec. 2005.
Millot, et al., "High-field Zeeman and paschen-back effects at high pressure in oriented ruby," Physical Review B, Oct. 2008.
Moriyama, et al., "Importance of electron-electron interactions and Zeeman splitting in single-wall carbon nanotube quantum dots," Physica E, Feb. 2005.
Mrozek, et al., "Circularly polarized microwaves for magnetic resonance study in the GHz range: Application to nitrogen-vacancy in diamonds," Applied Physics Letters, Jul. 2015.
Nagl, et al., "Improving surface and defect center chemistry of fluorescent nanodiamonds for imaging purposes—a review," Analytical and Bioanalaytical Chemistry, Oct. 2015.
Neumann, et al., "Excited-state spectroscopy of single NV defects in diamond using optically detected magnetic resonance," New Journal of Physics, Jan. 2009.
Nizovtsev & Kilin, "Optically Detected Magnetic Resonance Spectra of the 14NV-13C Spin Systems in Diamond: Analytical Theory and Experiment," Doklady of the National Academy of Sciences of Belarus, 2013.
Nizovtsev, et al., "Modeling fluorescence of single nitrogen-vacancy defect centers in diamond," Physica B—Condensed Matter, Dec. 2001.
Nizovtsev, et al., "Theoretical study of hyperfine interactions and optically detected magnetic resonance spectra by simulation of the C-291(NV)H—(172) diamond cluster hosting nitrogen-vacancy center," New Journal of Physics, Aug. 2014.
Nowodzinski, et al., "Nitrogen-Vacancy centers in diamond for current imaging at the redistributive layer level of Integrated Circuits," Microelectronics Reliability, Aug. 2015.
Nusran, et al., "Optimizing phase-estimation algorithms for diamond spin magnetometry," Physical Review B, Jul. 2014.
Ohashi, et al., "Negatively Charged Nitrogen-Vacancy Centers in a 5 nm Thin C-12 Diamond Film," Nano Letters, Oct. 2013.
Plakhotnik, et al., "Super-Paramagnetic Particles Chemically Bound to Luminescent Diamond : Single Nanocrystals Probed with Optically Detected Magnetic Resonance," Journal of Physical Chemistry C, Aug. 2015.
Rabeau, et al., "Implantation of labelled single nitrogen vacancy centers in diamond using N-15," Applied Physics Letters, Jan. 2006.
Ranjbar, et al., "Many-electron states of nitrogen-vacancy centers in diamond and spin density calculations," Physical Review B, Oct. 2011.
Reynhardt, "Spin-lattice relaxation of spin-1/2 nuclei in solids containing diluted paramagnetic impurity centers. I. Zeeman polarization of nuclear spin system," Concepts in Magnetic Resonance Part A, Sep. 2003.
Rogers, et al., "Singlet levels of the NV(-)centre in diamond," New Journal of Physics, Jan. 2015.
Rondin, et al., "Magnetometry with nitrogen-vacancy defects in diamond," Reports on Progress in Physics, May 2014.
Rondin, et al., "Nanoscale magnetic field mapping with a single spin scanning probe magnetometer," Applied Physics Letters, Apr. 2012.

(56) References Cited

OTHER PUBLICATIONS

Sarkar, et al., "Magnetic properties of graphite oxide and reduced graphene oxide," Physica E, 2014.
Scheuer, et al., "Accelerated 2D magnetic resonance spectroscopy of single spins using matrix completion," Scientific Reports, Dec. 2015.
Schirhagl, et al., "Nitrogen-vacancy centers in diamond: Nanoscale sensors for physics and biology," Annual Review of Physical Chemistry, Jan. 2014.
Schoenfeld & Harneit, "Real time magnetic field sensing and imaging using a single spin in diamond," Physical Review Letters, Jan. 2011.
Sedov, et al., "Si-doped nano- and microcrystalline diamond films with controlled bright photoluminescence of silicon-vacancy color centers," Diamond and Related Materials, Jun. 2015.
Shames, et al., "Magnetic resonance tracking of fluorescent nanodiamond fabrication," Journal of Physics D: Applied Physics, Apr. 2015.
Simanovskaia, et al., "Sidebands in optically detected magnetic resonance signals of nitrogen vacancy centers in diamond," Physical Review B, Jun. 2013.
Sotoma, et al., "Effective production of fluorescent nanodiamonds containing negatively-charged nitrogen-vacancy centers by ion irradiation," Diamond and Related Materials, Oct. 2014.
Steiner, et al., "Universal enhancement of the optical readout fidelity of single electron spins at nitrogen-vacancy centers in diamond," Physical Review B, Jan. 2010.
Steinert et al., "High-sensitivity magnetic imaging using an array of spins in diamond," Rev. Sci. Inst. (2010).
Steinert, et al., "High sensitivity magnetic imaging using an array of spins in diamond," Review of Scientific Instruments, Apr. 2010.
Stepanov, et al., "High-frequency and high-field optically detected magnetic resonance of nitrogen-vacancy centers in diamond," Applied Physics Letters, Feb. 2015.
Sternschulte, et al., "Uniaxial stress and Zeeman splitting of the 1.681 eV optical center in a homoepitaxial CVD diamond film," Diamond and Related Materials, Sep. 1995.
Storteboom, et al., "Lifetime investigation of single nitrogen vacancy centres in nanodiamonds," Optics Express, May 2015.
Tahara, et al., "Quantifying selective alignment of ensemble nitrogen-vacancy centers in (111) diamond," Applied Physics Letters, Nov. 2015.
Taylor, et al., "High-sensitivity diamond magnetometer with nanoscale resolution," Nature Physics, Oct. 2008.
Terblanche, et al., "13C spin-lattice relaxation in natural diamond: Zeeman relaxation at 4.7 T and 300 K due to fixed paramagnetic nitrogen defects," Solid State Nuclear Magnetic Resonance, Aug. 2001.
Terblanche, et al., "13C spin-lattice relaxation in natural diamond: Zeeman relaxation in fields of 500 to 5000 G at 300 K due to fixed paramagnetic nitrogen defects," Solid State Nuclear Magnetic Resonance, May 2001.
Tetienne, et al., "Magnetic-field-dependent photodynamics of single NV defects in diamond: an application to qualitative all-optical magnetic imaging," New Journal of Physics, Oct. 2012.
Tong, et al., "A hybrid-system approach for W state and cluster state generation," Optics Communication 310: 166-172 (2014).
Uhlen, et al., "New Diamond Nanofabrication process for hard x-ray zone plates," J. of Vacuum Science & Tech. B, 2011.
Vershovskii & Dmitriev, "Combined excitation of an optically detected magnetic resonance in nitrogen-vacancy centers in diamond for precision measurement of the components of a magnetic field vector," Technical Physics Letters, Nov. 2015.
Vershovskii & Dmitriev, "Micro-scale three-component quantum magnetometer based on nitrogen-vacancy color centers in diamond crystal," Technical Physics Letters, Apr. 2015.
Wang, et al., "Optimizing ultrasensitive single electron magnetometer based on nitrogen-vacancy center in diamond," Chinese Science Bulletin, Aug. 2013.
Webber, et al., "Ab initio thermodynamics calculation of the relative concentration of NV- and NV0 defects in diamond," Physical Review B, Jan. 2012.
Wolf, et al., "Subpicotesla Diamond Magnetometry," Physical Review X, Oct. 2015.
Wolfe, et al., "Off-resonant manipulation of spins in diamond via precessing magnetization of a proximal ferromagnet," Physical Review B, May 2014.
Xue & Liu, "Producing GHZ state of nitrogen-vacancy centers in cavity QED," Journal of Modern Optics, Mar. 2013.
Yang & Gu, "Novel calibration techniques for high pulsed-magnetic fields using luminescence caused by photo," Journal of Huazhong University of Science and Technology, Jun. 2007.
Yavkin, et al., "Defects in Nanodiamonds: Application of High-Frequency cw and Pulse EPR, ODMR," Applied Magnetic Resonance, Oct. 2014.
Yu, et al., "Bright fluorescent nanodiamonds: no photobleaching and low cytotoxicity," J. Am. Chem. Soc., 2005.
Zhang, et al., "Laser-polarization-dependent and magnetically controlled optical bistability in diamond nitrogen-vacancy centers," Physics Letters A, Nov. 2013.
Zhang, et al., "Laser-polarization-dependent spontaneous emission of the zero phonon line from single nitrogen-vacancy center in diamond," Chinese Physics B, Apr. 2014.
Zhang, et al., "Scalable quantum information transfer between nitrogen-vacancy-center ensembles," Annals of Physics, Apr. 2015.
Zhao, et al., "Atomic-scale magnetometry of distant nuclear spin clusters via nitrogen-vacancy spin in diamond," Nature Nanotechnology, Apr. 2011.
U.S. Appl. No. 15/446,373, filed Mar. 1, 2017.
U.S. Appl. No. 15/450,504, filed Mar. 6, 2017.
U.S. Appl. No. 15/454,162, filed Mar. 9, 2017.
U.S. Appl. No. 15/456,913, filed Mar. 13, 2017.
U.S. Appl. No. 15/468,356, filed Mar. 24, 2017.
U.S. Appl. No. 15/468,397, filed Mar. 24, 2017.
U.S. Appl. No. 15/468,386, filed Mar. 24, 2017.
U.S. Appl. No. 15/468,289, filed Mar. 24, 2017.
U.S. Appl. No. 15/468,641, filed Mar. 24, 2017.
U.S. Appl. No. 15/468,582, filed Mar. 24, 2017.
U.S. Appl. No. 15/468,410, filed Mar. 24, 2017.
U.S. Appl. No. 15/468,951, filed Mar. 24, 2017.
U.S. Appl. No. 15/468,559, filed Mar. 24, 2017.
U.S. Appl. No. 15/468,282, filed Mar. 24, 2017.
U.S. Appl. No. 15/468,314, filed Mar. 24, 2017.
U.S. Appl. No. 15/468,274, filed Mar. 24, 2017.
U.S. Appl. No. 15/468,303, filed Mar. 24, 2017.
U.S. Appl. No. 15/468,374, filed Mar. 24, 2017.
U.S. Appl. No. 15/476,636, filed Mar. 31, 2017.
U.S. Appl. No. 15/479,256, filed Apr. 4, 2017.
GB Office Action dated Jan. 10, 2017, in related national stage application GB1618202.4.
U.S. Appl. No. 14/659,498, filed Mar. 16, 2015.
U.S. Appl. No. 14/676,740, filed Apr. 1, 2015.
U.S. Appl. No. 15/003,678, filed Jan. 21, 2016.
U.S. Appl. No. 14/680,877, filed Apr. 7, 2015.
U.S. Appl. No. 15/003,281, filed Jan. 21, 2016.
U.S. Appl. No. 15/003,292, filed Jan. 21, 2016.
U.S. Appl. No. 15/003,298, filed Jan. 21, 2016.
U.S. Appl. No. 15/003,309, filed Jan. 21, 2016.
U.S. Appl. No. 15/003,176, filed Jan. 21, 2016.
U.S. Appl. No. 15/003,145, filed Jan. 21, 2016.
U.S. Appl. No. 15/003,336, filed Jan. 21, 2016.
U.S. Appl. No. 15/003,558, filed Jan. 21, 2016.
U.S. Appl. No. 15/003,519, filed Jan. 21, 2016.
U.S. Appl. No. 15/003,677, filed Jan. 21, 2016.
U.S. Appl. No. 15/003,256, filed Jan. 21, 2016.
U.S. Appl. No. 15/003,577, filed Jan. 21, 2016.
U.S. Appl. No. 15/003,704, filed Jan. 21, 2016.
U.S. Appl. No. 15/003,718, filed Jan. 21, 2016.
U.S. Appl. No. 15/003,062, filed Jan. 21, 2016.
U.S. Appl. No. 15/003,652, filed Jan. 21, 2016.
U.S. Appl. No. 15/003,634, filed Jan. 21, 2016.
U.S. Appl. No. 15/003,670, filed Jan. 21, 2016.

(56) References Cited

OTHER PUBLICATIONS

U.S. Appl. No. 15/003,088, filed Jan. 21, 2016.
U.S. Appl. No. 15/003,797, filed Jan. 21, 2016.
U.S. Appl. No. 15/003,590, filed Jan. 21, 2016.
U.S. Appl. No. 15/003,206, filed Jan. 21, 2016.
U.S. Appl. No. 15/003,193, filed Jan. 21, 2016.
U.S. Appl. No. 15/003,617, filed Jan. 21, 2016.
U.S. Appl. No. 15/003,396, filed Jan. 21, 2016.
U.S. Appl. No. 15/003,177, filed Jan. 21, 2016.
U.S. Appl. No. 15/003,209, filed Jan. 21, 2016.
U.S. Appl. No. 15/179,957, filed Jun. 10, 2016.
U.S. Appl. No. 15/207,457, filed Jul. 11, 2016.
U.S. Appl. No. 15/218,821, filed Jul. 25, 2016.
U.S. Appl. No. 15/204,675, filed Jul. 7, 2016.
U.S. Appl. No. 15/350,303, filed Nov. 14, 2016.
U.S. Appl. No. 15/351,862, filed Jul. 7, 2016.
U.S. Appl. No. 15/372,201, filed Dec. 7, 2016.
U.S. Appl. No. 15/376,244, filed Dec. 12, 2016.
U.S. Appl. No. 15/380,691, filed Dec. 15, 2016.
U.S. Appl. No. 15/382,045, filed Dec. 16, 2016.
U.S. Appl. No. 15/380,419, filed Dec. 15, 2016.
U.S. Appl. No. 15/419,832, filed Jan. 30, 2017.
U.S. Appl. No. 15/400,794, filed Jan. 6, 2017.
U.S. Appl. No. 15/443,422, filed Jan. 27, 2017.
U.S. Appl. No. 15/440,194, filed Feb. 23, 2017.
U.S. Appl. No. 15/437,222, filed Feb. 20, 2017.
U.S. Appl. No. 15/437,038, filed Feb. 20, 2017.
International Search Report and Written Opinion of the International Searching Authority in PCT/US2016/014390 dated Feb. 15, 2017.
Notice of Allowance dated Dec. 13, 2016, from related U.S. Appl. No. 14/680,877.
Notice of Allowance dated Dec. 22, 2016, from related U.S. Appl. No. 14/659,498.
U.S. Notice of Allowance dated Feb. 14, 2017, from related U.S. Appl. No. 15/003,677, 8 pages.
U.S. Office Action dated Feb. 10, 2017, from related U.S. Appl. No. 14/676,740, 38 pages.
U.S. Office Action dated Feb. 10, 2017, from related U.S. Appl. No. 15/003,088, 32 pages.
U.S. Office Action dated Feb. 16, 2017, from related U.S. Appl. No. 15/204,675, 15 pages.
Acosta et al., "Broadband magnetometry by Infrared-absorption detection of nitrogen-vacancy ensembles in diamond," Appl. Phys. Letters 97: 174104 (Oct. 29, 2010), 4 pages.
Barry et al., "Optical magnetic detection of single-neuron action potentials using quantum defects in diamond," as submitted to Quantum Physics on Feb. 2, 2016, 23 pages.
Constable, "Geomagnetic Spectrum, Temporal." In Encyclopedia of Geomagnetism and Paleomagnetism, pp. 353-355, Springer: Dordrecht, Netherlands (2007).
International Search Report and Written Opinion of the International Searching Authority dated Apr. 1, 2016 from related PCT application PCT/US2016/014384, 12 pages.
International Search Report and Written Opinion of the International Searching Authority dated Apr. 11, 2016 from related PCT application PCT/US2016/014376, 12 pages.
International Search Report and Written Opinion of the International Searching Authority dated Apr. 11, 2016 from related PCT application PCT/US2016/014388, 14 pages.
International Search Report and Written Opinion of the International Searching Authority dated Apr. 11, 2016 from related PCT application PCT/US2016/014395, 15 pages.
International Search Report and Written Opinion of the International Searching Authority dated Jul. 6, 2015, from related PCT application PCT/US2015/021093, 9 pages.
International Search Report and Written Opinion of the International Searching Authority dated Jul. 8, 2015, from related PCT application PCT/US2015/024265, 11 pages.
International Search Report and Written Opinion of the International Searching Authority dated Jul. 12, 2016, from related PCT application PCT/US2016/014287, 14 pages.
International Search Report and Written Opinion of the International Searching Authority dated Jul. 16, 2015, from related PCT application PCT/US2015/24723, 8 pages.
International Search Report and Written Opinion of the International Searching Authority dated Jun. 10, 2016 from related PCT application PCT/US2016/014290, 11 pages.
International Search Report and Written Opinion of the International Searching Authority dated Jun. 2, 2016, from related PCT application PCT/US2016/014386, 14 pages.
International Search Report and Written Opinion of the International Searching Authority dated Jun. 2, 2016, from related PCT application PCT/US2016/014387, 13 pages.
International Search Report and Written Opinion of the International Searching Authority dated Jun. 6, 2016, from related PCT application PCT/US2016/014291, 13 pages.
International Search Report and Written Opinion of the International Searching Authority dated Jun. 9, 2016 from related PCT application PCT/US2016/014333, 16 pages.
International Search Report and Written Opinion of the International Searching Authority dated Mar. 24, 2016 from related PCT application PCT/US2016/014336, 17 pages.
International Search Report and Written Opinion of the International Searching Authority dated Mar. 24, 2016 from related PCT application PCT/US2016/014297, 15 pages.
International Search Report and Written Opinion of the International Searching Authority dated Mar. 24, 2016 from related PCT application PCT/US2016/014392, 8 pages.
International Search Report and Written Opinion of the International Searching Authority dated Mar. 24, 2016 from related PCT application PCT/US2016/014403, 10 pages.
International Search Report and Written Opinion of the International Searching Authority dated Mar. 25, 2016, from related PCT application PCT/US2016/014363, 8 pages.
International Search Report and Written Opinion of the International Searching Authority dated Mar. 25, 2016, from related PCT application PCT/US2016/014389, 19 pages.
International Search Report and Written Opinion of the International Searching Authority dated Mar. 28, 2016, from related PCT application PCT/US2016/014380, 9 pages.
International Search Report and Written Opinion of the International Searching Authority dated Mar. 28, 2016, from related PCT application PCT/US2016/014394, 17 pages.
International Search Report and Written Opinion of the International Searching Authority dated Mar. 29, 2016 from related PCT application PCT/US2016/014325, 11 pages.
International Search Report and Written Opinion of the International Searching Authority dated Mar. 29, 2016 from related PCT application PCT/US2016/014330, 8 pages.
International Search Report and Written Opinion of the International Searching Authority dated Mar. 29, 2016, from related PCT application PCT/US2016/014328, 7 pages.
International Search Report and Written Opinion of the International Searching Authority dated Mar. 29, 2016 from related PCT application PCT/US2016/014385, 11 pages.
International Search Report and Written Opinion of the International Searching Authority dated Mar. 30, 2016 from related PCT application PCT/US2016/014298, 14 pages.
International Search Report and Written Opinion of the International Searching Authority dated Mar. 31, 2016 from related PCT application PCT/US2016/014375, 11 pages.
International Search Report and Written Opinion of the International Searching Authority dated Mar. 31, 2016 from related PCT application PCT/US2016/014396, 11 pages.
International Search Report and Written Opinion of the International Searching Authority dated May 26, 2016, 2016 from related PCT application PCT/US2016/014331, 15 pages.
Le Sage et al., "Efficient photon detection from color centers in a diamond optical waveguide," Phys. Rev. B 85: 121202(R), pp. 121202-1-121202-4, (Mar. 23, 2012).

(56) References Cited

OTHER PUBLICATIONS

Macquarie et al., "Mechanical spin control of nitrogen-vacancy centers in diamond," Retrieved from http://www.arxiv.org/pdf/1306.6356.pdf, pp. 1-8, (Jun. 2013).
Nobauer et al., "Smooth optimal quantum control for robust solid state spin magnetometry," Retrieved from http://www.arxiv.org/abs/1412.5051, pp. 1-12, (Dec. 2014).
Polatomic. "AN/ASQ-233A Digital Magnetic Anomaly Detecting Set." Retrieved May 9, 2016, from http://polatomic.com/images/DMAD_Data_Sheet_09-2009.pdf (2009), 1 page.
Poole, "What is GMSK Modulation—Gaussian Minimum Shift Keying." Radio-Electronics, retrieved from https://web.archive.org/web/20150403045840/http://www.radio-electronics.com/info/rf-technology-design/pm-phase-modulation/what-is-gmsk-gaussian-minimum-shift-keyingtutorial.php (Apr. 3, 2015), 4 pages.
Shao et al., "Diamond Color Center Based FM Microwave Demodulator," in Conference on Lasers and Electro-Optics, OSA Technical Digest (online) (Optical Society of America), paper JTh2A.136, 2 pages. (Jun. 5-10, 2016).
U.S. Notice of Allowance dated Apr. 20, 2016, from related U.S. Appl. No. 15/003,718, 9 pages.
U.S. Notice of Allowance dated Mar. 29, 2016, from related U.S. Appl. No. 15/003,590, 11 pages.
U.S. Office Action dated Jul. 29, 2016 from related U.S. Appl. No. 14/680,877, 8 pages.
U.S. Office Action dated May 13, 2016, from related U.S. Appl. No. 14/676,740, 15 pages.
U.S. Office Action dated May 6, 2016, from related U.S. Appl. No. 14/659,498, 20 pages.
Wahlstrom et al., "Modeling Magnetic Fields Using Gaussian Processes," 2013 IEEE International Conference on Acoustics, Speech, and Signal Processing, pp. 3522-3526 (May 26-31, 2013).
Brenneis, et al. "Ultrafast electronic readout of diamond nitrogen-vacancy centres coupled to graphene." Nature nanotechnology 10.2 (2015): 135-139.
Chavez, et al. "Detecting Arctic oil spills with NMR: a feasibility study." Near Surface Geophysics 13.4 (Feb. 2015): 409-416.
Dale, et al. "Medical applications of diamond magnetometry: commercial viability," arXiv preprint arXiv:1705.01994 (May 8, 2017), pp. 1-7.
Fologea, et al. "Detecting single stranded DNA with a solid state nanopore." Nano Letters 5.10 (Aug. 15, 2005): 1905-1909.
Gaebel, et al. "Room-temperature coherent coupling of single spins in diamond." Nature Physics 2.6 (May 28, 2006): 408-413.
Heerema, et al. "Graphene nanodevices for DNA sequencing." Nature nanotechnology 11.2 (Feb. 3, 2016): 127-136.
International Search Report and Written Opinion of the International Searching Authority dated Apr. 4, 2017 from related PCT application PCT/US16/68366, 9 pages.
International Search Report and Written Opinion of the International Searching Authority dated Mar. 13, 2017 from related PCT application PCT/US2016/68320, 10 pages.
International Search Report and Written Opinion of the International Searching Authority dated Mar. 27, 2017 from related PCT application PCT/US16/68344, 6 pages.
International Search Report and Written Opinion of the International Searching Authority dated Mar. 31, 2017 from related PCT application PCT/US2016/066566, 11 pages.
International Search Report and Written Opinion of the International Searching Authority dated May 10, 2017 from related PCT application PCT/US17/19411, 8 pages.
International Search Report and Written Opinion of the International Searching Authority dated May 18, 2017, from related PCT application PCT/US2017/021593, 10 pages.
International Search Report and Written Opinion of the International Searching Authority dated May 19, 2017 from related PCT application PCT/US17/18099, 16 pages.
International Search Report and Written Opinion of the International Searching Authority dated May 3, 2017 from related PCT application PCT/US2017/018701, 8 pages.
International Search Report and Written Opinion of the International Searching Authority dated May 4, 2017 from related PCT application PCT/US2017/018709, 8 pages.
International Search Report and Written Opinion of the International Searching Authority dated May 8, 2017 from related PCT application PCT/US2017/17321, 17 pages.
Keyser "Enhancing nanopore sensing with DNA nanotechnology." Nature nanotechnology 11.2 (Feb. 2016): 106-108.
Lindsay "The promises and challenges of solid-state sequencing." Nature nanotechnology 11.2 (Feb. 2016): 109-111.
Matlashov, et al. "SQUIDs for magnetic resonance imaging at ultra-low magnetic field." PIERS online 5.5 (2009): 466-470.
Matlashov, et al. "SQUIDs vs. induction coils for ultra-low field nuclear magnetic resonance: experimental and simulation comparison." IEEE Transactions on Applied Superconductivity 21.3 (Jan. 1, 2012): 465-468.
Moessle, et al. "SQUID-detected magnetic resonance imaging in microtesla fields." Annu. Rev. Biomed. Eng. 9 (May 23, 2008): 389-413.
Pelliccione, et al., Two-dimensional nanoscale imaging of gadolinium spins via scanning probe relaxometry with a single spin in diamond, Phys. Rev. Applied 2.5, (Sep. 8, 2014): 054014 pp. 1-17.
Qiu et al., "Low-field NMR Measurement Procedure when SQUID Detection is Used," IEEE/CSC & ESAS European Superconductivity News Forum, No. 5, Jul. 2008.
Qiu, et al. "SQUID-detected NMR in Earth's magnetic field." Journal of Physics: Conference Series. vol. 97. No. 1. IOP Publishing, Mar. 2008, pp. 1-7.
Steinert et al., "Magnetic spin imaging under ambient conditions with sub-cellular resolution." Nature Comms 4:1607 (Mar. 19, 2013).
Sushkov, et al. "All-optical sensing of a single-molecule electron spin." Nano letters 14.11 (Nov. 7, 2013): 6443-6448.
Tetienne, et al. "Spin relaxometry of single nitrogen-vacancy defects in diamond nanocrystals for magnetic noise sensing." Physical Review B 87.23 (Apr. 3, 2013): 235436-1-235436-5.
U.S. Notice of Allowance dated Mar. 15, 2017, from related U.S. Appl. No. 15/351,862, 6 pages.
U.S. Notice of Allowance dated May 26, 2017 from related U.S. Appl. No. 15/218,821, 7 pages.
U.S. Office Action dated Apr. 17, 2017, from related U.S. Appl. No. 15/003,558, 12 pages.
U.S. Office Action dated Mar. 1, 2017, from related U.S. Appl. No. 15/003,634, 7 pages.
U.S. Office Action dated Mar. 16, 2017, from related U.S. Appl. No. 15/218,821, 7 pages.
U.S. Office Action dated May 22, 2017, from related U.S. Appl. No. 15/003,206, 12 pages.
Wells, et al. "Assessing graphene nanopores for sequencing DNA." Nano letters 12.8 (Jul. 10, 2012): 4117-4123.
Wysocki et al., "Modified Walsh-Hadamard sequences for DS CDMA wireless systems." Int. J. Adaptive Control and Signal Processing 16(8): 589-602 (Oct. 2002; first published online Sep. 23, 2002), 25 pages.
Bucher et al, "High Resolution Magnetic Resonance Spectroscopy Using Solid-State Spins", May 25, 2017, downloaded from https://arXiv.org/ (arXiv.org > quant-ph > arXiv:1705.08887) on May 25, 2017, pp. 1-24.
International Search Report and Written Opinion of the International Searching Authority dated Jun. 1, 2017, from related PCT application PCT/US17/21811, 9 pages.
International Search Report and Written Opinion of the International Searching Authority dated Jun. 1, 2017, in related PCT application PCT/US17/22279, 20 pages.
International Search Report and Written Opinion of the International Searching Authority dated Jun. 15, 2017, from related PCT application PCT/US2017/024175, 10 pages.
International Search Report and Written Opinion of the International Searching Authority dated Jun. 9, 2017, from related patent application PCT/US2017/024181, 13 pages.
International Search Report and Written Opinion of the International Searching Authority dated Jun. 9, 2017, from related PCT application PCT/US2017/024179, 9 pages.

(56) References Cited

OTHER PUBLICATIONS

International Search Report and Written Opinion of the International Searching Authority dated Jul. 14, 2017, from related PCT application PCT/US2017/022118, 13 pages.
International Search Report and Written Opinion of the International Searching Authority dated Jul. 17, 2017, from related PCT application PCT/US2017/024177, 11 pages.
International Search Report and Written Opinion of the International Searching Authority dated Jul. 18, 2017, from related PCT application PCT/US2017/024167, 11 pages.
International Search Report and Written Opinion of the International Searching Authority dated Jul. 18, 2017, from related PCT application PCT/US2017/024173, 13 pages.
International Search Report and Written Opinion of the International Searching Authority dated Jul. 19, 2017, from related PCT application PCT/US2017/024171, 12 pages.
International Search Report and Written Opinion of the International Searching Authority dated Jun. 15, 2017, from related PCT application PCT/US2017/024182, 21 pages.
International Search Report and Written Opinion of the International Searching Authority dated Jun. 22, 2017, in related PCT application PCT/US2017/024180, 10 pages.
International Search Report and Written Opinion of the International Searching Authority dated Jun. 5, 2017, from related PCT application PCT/US2017/024169, 11 pages.
International Search Report and Written Opinion of the International Searching Authority dated Jun. 5, 2017, from related PCT application PCT/US2017/024174, 8 pages.
International Search Report and Written Opinion of the International Searching Authority dated Jun. 5, 2017, in related PCT application PCT/US2017/024168, 7 pages.
International Search Report and Written Opinion of the International Searching Authority dated Jun. 6, 2017, from related PCT application PCT/2017/024165, 9 pages.
International Search Report and Written Opinion of the International Searching Authority dated Jun. 6, 2017, from related PCT application PCT/US2017/024172, 9 pages.
Michaelovich et al., "Polarization Dependencies of the Nitrogen-Vacancy Center." Undergraduate Project Report, Ben-Gurion University, Aug. 2015, pp. 1-9.
Notice of Allowance dated Jun. 8, 2017, from related U.S. Appl. No. 15/351,862, 7 pages.
Sheinker et al., "Localization in 3-D Using Beacons of Low Frequency Magnetic Field." IEEE Transactions on Instrumentation and Measurement 62(12): 3194-3201 (Dec. 2013), 8 pages.
U.S. Corrected Notice of Allowance dated Jun. 29, 2017 from related U.S. Appl. No. 15/351,862, 4 pages.
U.S. Notice of Allowance dated Aug. 11, 2017 from related U.S. Appl. No. 15/003,558, 5 pages.
U.S. Notice of Allowance dated Jul. 18, 2017 from related U.S. Appl. No. 15/003,634, 6 pages.
U.S. Notice of Allowance dated Jun. 20, 2017, from related U.S. Appl. No. 15/204,675, 9 pages.
U.S. Notice of Allowance dated Jun. 28, 2017 from related U.S. Appl. No. 15/003,256, 10 pages.
U.S. Office Action dated Aug. 15, 2017 from related U.S. Appl. No. 15/003,281, 12 pages.
U.S. Office Action dated Jul. 27, 2017 from related U.S. Appl. No. 15/003,577, 15 pages.
U.S. Office Action dated Jun. 1, 2017, from related U.S. Appl. No. 15/003,797, 29 pages.
U.S. Office Action dated Jun. 1, 2017, from related U.S. Appl. No. 15/179,957, 29 pages.
U.S. Office Action dated Jun. 12, 2017, from related U.S. Appl. No. 15/003,256, 9 pages.
U.S. Office Action dated Jun. 12, 2017, from related U.S. Appl. No. 15/003,336, 14 pages.
U.S. Office Action dated Jun. 16, 2017, from related U.S. Appl. No. 15/003,678, 15 pages.
U.S. Office Action dated Jun. 2, 2017, from related U.S. Appl. No. 15/476,636, 10 pages.
Wroble, "Performance Analysis of Magnetic Indoor Local Positioning System." Western Michigan University Master's Theses, Paper 609 (Jun. 2015), 42 pages.
International Search Report and Written Opinion from related PCT application PCT/US2017/035315 dated Aug. 24, 2017, 7 pages.
Ramsey, et al., "Phase Shifts in the Molecular Beam Method of Separated Oscillating Fields", Physical Review, vol. 84, No. 3, Nov. 1, 1951, pp. 506-507.
U.S. Notice of Allowance on U.S. Appl. No. 14/676,740 dated Sep. 1, 2017, 7 pages.
U.S. Notice of Allowance on U.S. Appl. No. 15/003,206 dated Sep. 18, 2017, 11 pages.
U.S. Notice of Allowance on U.S. Appl. No. 15/003,281 dated Sep. 26, 2017, 7 pages.
U.S. Notice of Allowance on U.S. Appl. No. 15/476,836 dated Sep. 14, 2017, 10 pages.
U.S. Office Action on U.S. Appl. No. 15/003,176 dated Sep. 27, 2017, 8 pages.
U.S. Office Action on U.S. Appl. No. 15/003,292 dated Sep. 8, 2017, 8 pages.

\* cited by examiner

IN-SITU POWER CHARGING

CROSS REFERENCE TO RELATED APPLICATIONS

The present application claims the benefit of U.S. Provisional Application Nos. 62/109,006, filed Jan. 28, 2015, and 62/109,551, filed Jan. 29, 2015, each of which is incorporated by reference herein in its entirety. The present application is related to co-pending U.S. application Ser. No. 15/003,206, filed Jan. 21, 2016, titled "MAGNETIC NAVIGATION METHODS AND SYSTEMS UTILIZING POWER GRID AND COMMUNICATION NETWORK,", and U.S. application Ser. No. 15/003,193, filed Jan. 21, 2016, titled "RAPID HIGH-RESOLUTION MAGNETIC FIELD MEASUREMENTS FOR POWER LINE INSPECTION,", each of which is incorporated by reference herein in its entirety.

TECHNICAL FIELD

The present disclosure relates, in general, to charging power sources wirelessly. More particularly, the present disclosure relates to using a magnetometer to orient a wireless charging device.

BACKGROUND

The following description is provided to assist the understanding of the reader. None of the information provided or references cited is admitted to be prior art. A magnetic field can induce a current into a conductor. The conductor can be connected to a power source to charge the power source. It may be useful to orient the conductor to most effectively use the magnetic field.

SUMMARY

An illustrative device includes a propulsion unit configured to move the device and a steering unit configured to control the direction that the device moves in. The device may also include a power unit configured to provide power to the propulsion unit and a charging unit configured to use an electric field to provide electrical power to the power unit. The device may further include a first magnetic sensor configured to determine a vector of one or more magnetic fields and a processor communicatively coupled to the propulsion unit, the steering unit, the power unit, and the magnetic sensor. The processor may be configured to receive, from the magnetic sensor, a time-varying signal indicative of a magnetic field and determine, based on the time-varying signal, that the magnetic field associated with an electrical power transmission line. The processor may be further configured to cause the steering unit to direct the device toward the electrical power transmission line.

An illustrative method includes receiving, at a processor, a time-varying signal from a first magnetic sensor. The time-varying signal may be indicative of a magnetic field. The method may also include determining, based on the time-varying signal, that the magnetic field is caused by an electrical power transmission line. The method may further include causing a steering unit of a device to direct the device toward the electrical power transmission line. In some embodiments, the method also includes charging a power unit of the device by using an electromagnetic field generated by the electrical power transmission line.

An illustrative device may include a propulsion unit configured to move the device, a power unit configured to provide power to the propulsion unit, and a charging unit configured to use an electric field to provide electrical power to the power unit. The device may further include a first magnetic sensor configured to determine a vector of a magnetic field of an electrical power transmission line and a transceiver configured to transmit to a receiver the vector of the magnetic field.

An illustrative system includes a vehicle and a transceiver unit. The vehicle may include a propulsion unit configured to move the vehicle, a power unit configured to provide power to the propulsion unit, and a charging unit configured to use an electric field to provide electrical power to the power unit. The vehicle also may include a first magnetic sensor configured to determine a vector of a magnetic field of an electrical power transmission line and a transceiver configured to transmit a signal indicating the vector of the magnetic field. The transceiver unit may be configured receive the signal.

An illustrative device may include a propulsion unit configured to move the device, a first magnetic sensor configured to determine a first vector of a magnetic field, and a power unit configured to provide power to the propulsion unit. The device may also include a charging unit configured to use an electric field to provide electrical power to the power unit. The electric field and the magnetic field are associated with an electrical power transmission line.

The foregoing summary is illustrative only and is not intended to be in any way limiting. In addition to the illustrative aspects, embodiments, and features described above, further aspects, embodiments, and features will become apparent by reference to the following drawings and the detailed description.

Figure 1:
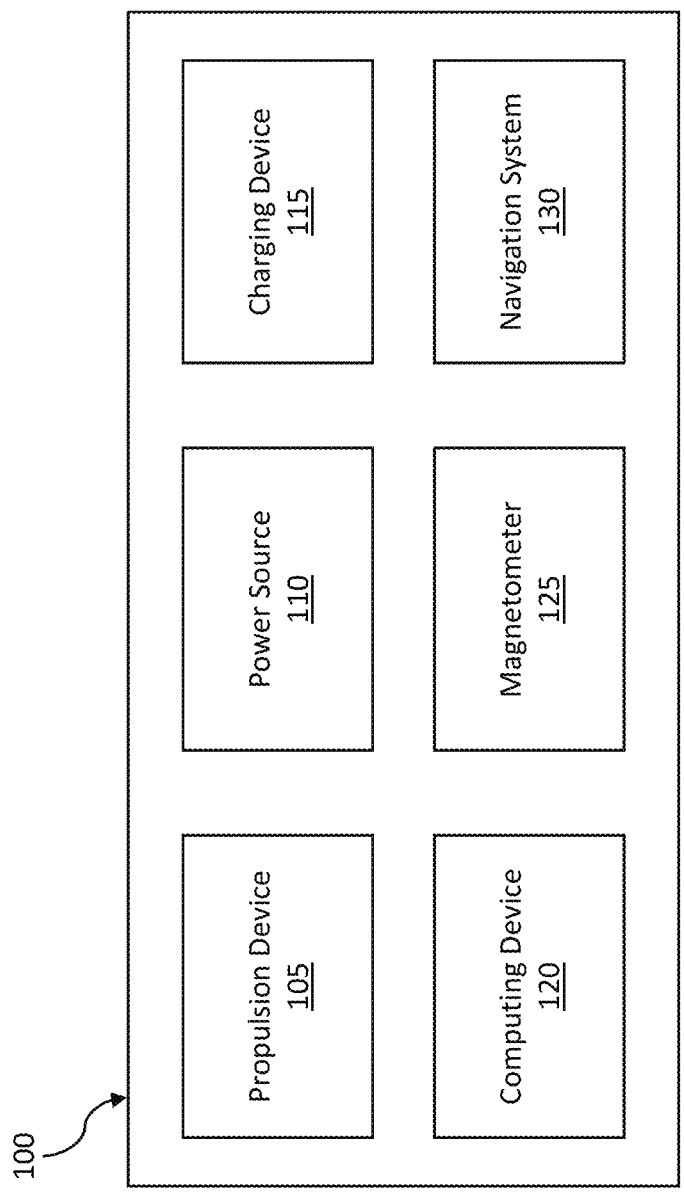
FIG. 1 is a block diagram of a vehicular system in accordance with an illustrative embodiment.

The foregoing and other features of the present disclosure will become apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and make part of this disclosure.

Nitrogen-vacancy centers (NV centers) are defects in a diamond's crystal structure, which can purposefully be manufactured in synthetic diamonds. In general, when excited by green light and microwave radiation, the NV centers cause the diamond to generate red light. When an excited NV center diamond is exposed to an external magnetic field, the frequency of the microwave radiation at which the diamond generates red light and the intensity of the light change. By measuring the changes, the NV centers can be used to accurately detect the magnetic field strength.

As discussed in greater detail in co-pending U.S. application Ser. No. 15/003,206, filed Jan. 21, 2016, titled "MAGNETIC NAVIGATION METHODS AND SYSTEMS UTILIZING POWER GRID AND COMMUNICATION NETWORK,", and U.S. application Ser. No. 15/003,193, filed Jan. 21, 2016, titled "RAPID HIGH-RESOLUTION MAGNETIC FIELD MEASUREMENTS FOR POWER LINE INSPECTION,", each of which is incorporated by reference herein in its entirety, overhead power lines can be used as a navigation tool for unmanned vehicles (or any other suitable vehicle). For example, a magnetometer can be used to detect magnetic fields generated by current traveling through the lines. In various embodiments described herein, such power lines can be used to charge batteries of the unmanned vehicles. An onboard magnetometer can be used to detect the power lines and navigate the vehicle to an appropriate location to charge the batteries of the vehicle. The electric field surrounding the power lines can be used to induce a current in a coil. The induced current can be used to charge batteries or power components.

FIG. 1 is a block diagram of a vehicular system in accordance with an illustrative embodiment. An illustrative vehicular system 100 includes a propulsion device 105, a power source 110, a charging device 115, a computing device 120, a magnetometer 125, and a navigation system 130. In alternative embodiments, additional, fewer, and/or different elements may be used.

In an illustrative embodiment, the vehicular system 100 is an unmanned aircraft system. For example, the vehicular system 100 can be an aerial drone such as a fixed wing vehicle or a rotary vehicle. In some embodiments, the vehicular system 100 is a surface vehicle such as an unmanned boat or land vehicle. In some embodiments, the vehicular system 100 can be a robot. The vehicular system 100 can be autonomous or remotely controlled. In yet other embodiments, the vehicular system 100 can be a manned vehicle. In alternative embodiments, the vehicular system 100 can be any suitable vehicle.

The vehicular system 100 includes the propulsion device 105. The propulsion device 105 can be any suitable device or system configured to propel or otherwise move the vehicular system 100. For example, the propulsion device 105 can include one or more propellers, an internal combustion engine, a jet engine, wings, wheels, motors, pumps, etc.

The vehicular system 100 includes the power source 110. The power source 110 can be configured to provide power to one or more of the components of the vehicular system 100. For example, the power source power source 110 can include one or more batteries that provide power to the propulsion device 105, the computing device 120, the magnetometer 125, etc.

The vehicular system 100 includes the charging device 115. The charging device 115 can be any suitable device configured to provide power to the power source 110. For example, the charging device 115 is configured to charge batteries of the power source 110. In an illustrative embodiment, the charging device 115 includes one or more coils of conductive material (e.g., coils of wire). When an electromagnetic field is applied to the coils, a current can be induced in the coils. The induced current can be provided to the power source 110 to, for example, charge batteries. In alternative embodiments, any suitable charging device 115 may be used. In alternative embodiments, the induced current can be used for any suitable purpose, such as providing power to one or more of the components of the vehicular system 100.

The vehicular system 100 includes the computing device 120. The computing device 120 can be any suitable computing device. For example, the computing device 120 can include a processor, memory, communication links, etc. The computing device 120 can be in communication with one or more of the other components of the vehicular system 100. For example, the computing device 120 can communicate with the propulsion device 105 to control the direction and speed of the vehicular system 100. In another example, the computing device 120 can communicate with the magnetometer 125 and receive measurements taken by the magnetometer 125. In yet another example, the computing device 120 can communicate with the navigation system 130 to determine the location of the vehicular system 100.

The vehicular system 100 includes a magnetometer 125. The magnetometer 125 can be any suitable device that measures a magnetic field. In an illustrative embodiment, the magnetometer 125 has a sensitivity of one to ten pico Tesla. In alternative embodiments, the sensitivity can be less than one pico Tesla or greater than ten pico Tesla. In an illustrative embodiment, with one hundred amps traveling through the line, the magnetometer 125 has an angular sensitivity of between nine pico Tesla per degree to thirty pico Tesla per degree at five meters from the line, between ten pico Tesla per degree and fifteen pico Tesla per degree at ten meters from the power line, and between three pico Tesla per degree and twelve pico Tesla per degree at fifteen meters from the power line. In another embodiment, with one thousand amps traveling through the line, the magneto meter 125 has an angular sensitivity of between ninety pico Tesla per degree to three hundred pico Tesla per degree at five meters from the line, between fifty pico Tesla per degree and one hundred and fifty pico Tesla per degree at ten meters from the power line, and between forty pico Tesla per degree and one hundred and ten pico Tesla per degree at fifteen meters from the power line. In alternative embodiments, the magnetometer 125 can have any suitable angular sensitivity.

In some embodiments, the magnetometer 125 can be relatively small and/or lightweight. In some embodiments, the magnetometer 125 consumes relatively little power. Such characteristics are suitable for various vehicular system 100. For example, by consuming relatively little power, the magnetometer 125 allows the power source 110 to be used for other components, such as the propulsion device 105. Additionally, by being lightweight, less energy is required from the power source 110 to move the magnetometer 125. In an illustrative embodiment, the magnetometer 125 can weigh about 0.1 kilograms. In alternative embodiments, the magnetometer 125 weighs less than 0.1 kilograms or greater than 0.1 kilograms. In some embodiments, the magnetometer 125 consumes less than two Watts of power. In alternative embodiments, the magnetometer 125 consumes greater than two Watts of power.

As discussed in greater detail below, in an illustrative embodiment, the magnetometer 125 is configured to measure the direction of a magnetic field. The magnetic field at any given point can be characterized by using a vector. The vector includes a magnitude and a direction. In an illustrative embodiment, the magnetometer 125 is configured to measure the magnitude and the direction of a magnetic field at the location of the magnetometer 125. In alternative embodiments, the magnetometer 125 is configured to measure the magnitude or the direction of the magnetic field.

In an illustrative embodiment, the magnetometer 125 uses a diamond with NV centers to measure the magnetic field. A diamond-based magnetometer 125 may be suited for use in the vehicular system 100. For example, a diamond-based magnetometer 125 can have a sensitivity of one pico Tesla or greater, can weigh about 0.1 kilograms, and can consume about two Watts of power. Additionally, a diamond-based magnetometer 125 can measure the magnitude and direction of a magnetic field. Any suitable diamond-based magnetometer 125 may be used. In alternative embodiments, the magnetometer 125 may not be diamond based. In such embodiments, any suitable magnetometer 125 may be used.

The vehicular system 100 includes a navigation system 130. The navigation system 130 can be any suitable system or device that can provide navigation features to the vehicular system 100. For example, the navigation system 130 can include maps, global positioning system (GPS) sensors, or communication systems.

In an illustrative embodiment, the navigation system 130 includes a magnetic waypoint database. The magnetic waypoint database can include a map of an area or space that includes known magnetic flux vectors. For example, the magnetic waypoint database can include previously determined magnetic flux vectors in a one cubic mile volume of the atmosphere. In such an example, the density of the magnetic waypoint database can be one vector per cubic meter. In alternative embodiments, the magnetic waypoint database can include previously determined flux vectors for a volume larger than one cubic mile. For example, the magnetic waypoint database can include a map of vectors for a city, town, state, province, country, etc. In an illustrative embodiment, the magnetic waypoint database can be stored on a remote memory device. Relevant information, such as nearby vectors, can be transmitted to the navigation system 130. Any suitable vector density can be used. For example, the vector density can be less than or greater than one vector per cubic meter. The magnetic waypoint database can be used for navigation and/or identifying power sources that can be used to charge batteries of the vehicle.

Although not illustrated in FIG. 1, the vehicular system 100 may include any other suitable components. For example, the vehicular system 100 can include surveillance cameras, communication systems for transmitting and/or receiving information, weapons, or sensors. In an illustrative embodiment, the vehicular system 100 includes sensors that assist the vehicular system 100 in navigating around objects.

In an illustrative embodiment, the vehicular system 100 is an autonomous vehicle. In alternative embodiments, the vehicular system 100 can be controlled remotely. For example, the vehicular system 100 can each communicate with a control unit. The vehicular system 100 and the control unit can include transceivers configured to communicate with one another. Any suitable transceivers and communication protocols can be used. In such an embodiment, the vehicular system 100 can transmit to the control unit any suitable information. For example, the vehicular system 100 can transmit to the control unit measurements of the magnetic field sensed by the magnetometer 125. In such an embodiment, the control unit can display to a user the measurement, which can be a vector. The user can use the measurement to navigate the vehicular system 100 to a position in which the charging device 115 can charge the power source 110.

Figure 2:
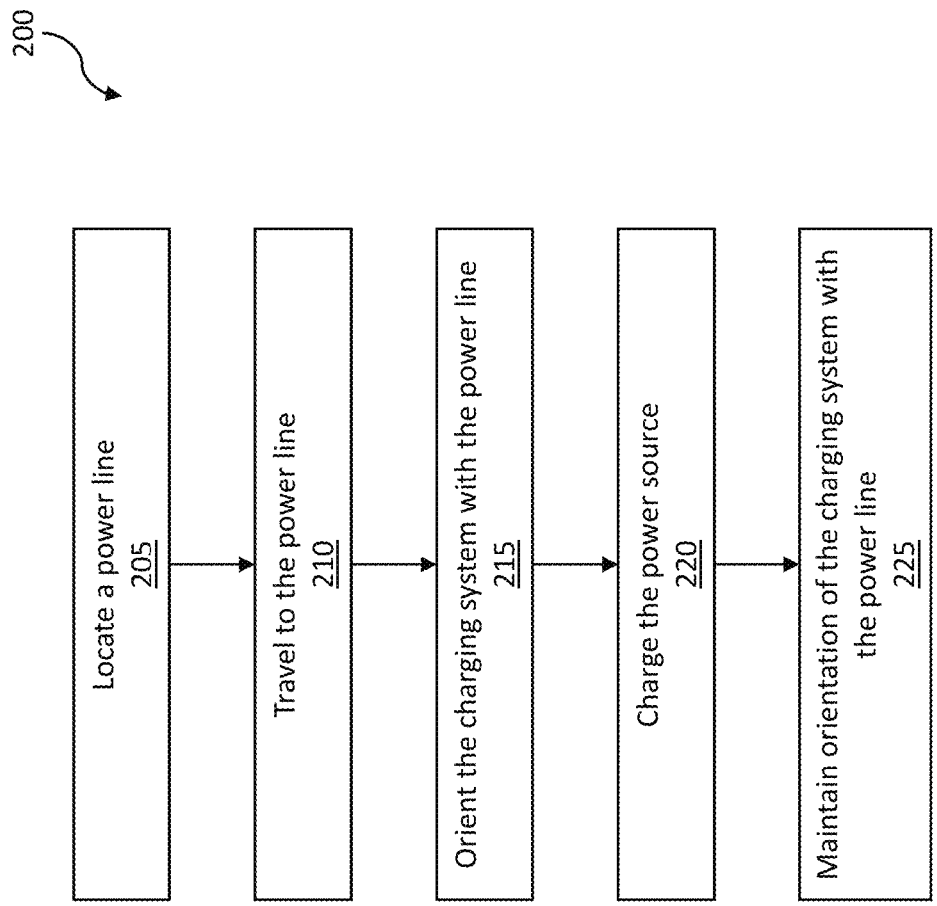
FIG. 2 is a flow chart of a method for charging a power source in accordance with an illustrative embodiment.

FIG. 2 is a flow chart of a method for charging a power source in accordance with an illustrative embodiment. In alternative embodiments, additional, fewer, and/or different operations may be performed. Also, the use of a flow chart and/or arrows is not meant to be limiting with respect to the order or flow of operations. For example, in some embodiments, two or more of the operations may be performed simultaneously.

In an operation 205, power lines are located. Power lines can be located using any suitable method. In an illustrative embodiment, a magnetometer can be used to detect a magnetic field of the power lines. The measured magnetic field can be used to identify the direction of the power lines. For example, one or more of the embodiments described in co-pending U.S. application Ser. No. 15/003,206, filed Jan. 21, 2016, titled "MAGNETIC NAVIGATION METHODS AND SYSTEMS UTILIZING POWER GRID AND COMMUNICATION NETWORK,", and U.S. application Ser. No. 15/003,193, filed Jan. 21, 2016, titled "RAPID HIGH-RESOLUTION MAGNETIC FIELD MEASUREMENTS FOR POWER LINE INSPECTION," may be used. In alternative embodiments, a map of known power lines can be used to locate the power lines. For example, a magnetic waypoint database can be used to locate power lines. In yet other embodiments, sensors other than a magnetometer can be used (e.g., in conjunction with the magnetometer) to locate the power lines. For example, cameras, ultrasonic sensors, lasers, etc. can be used to locate the power lines.

Figure 3:
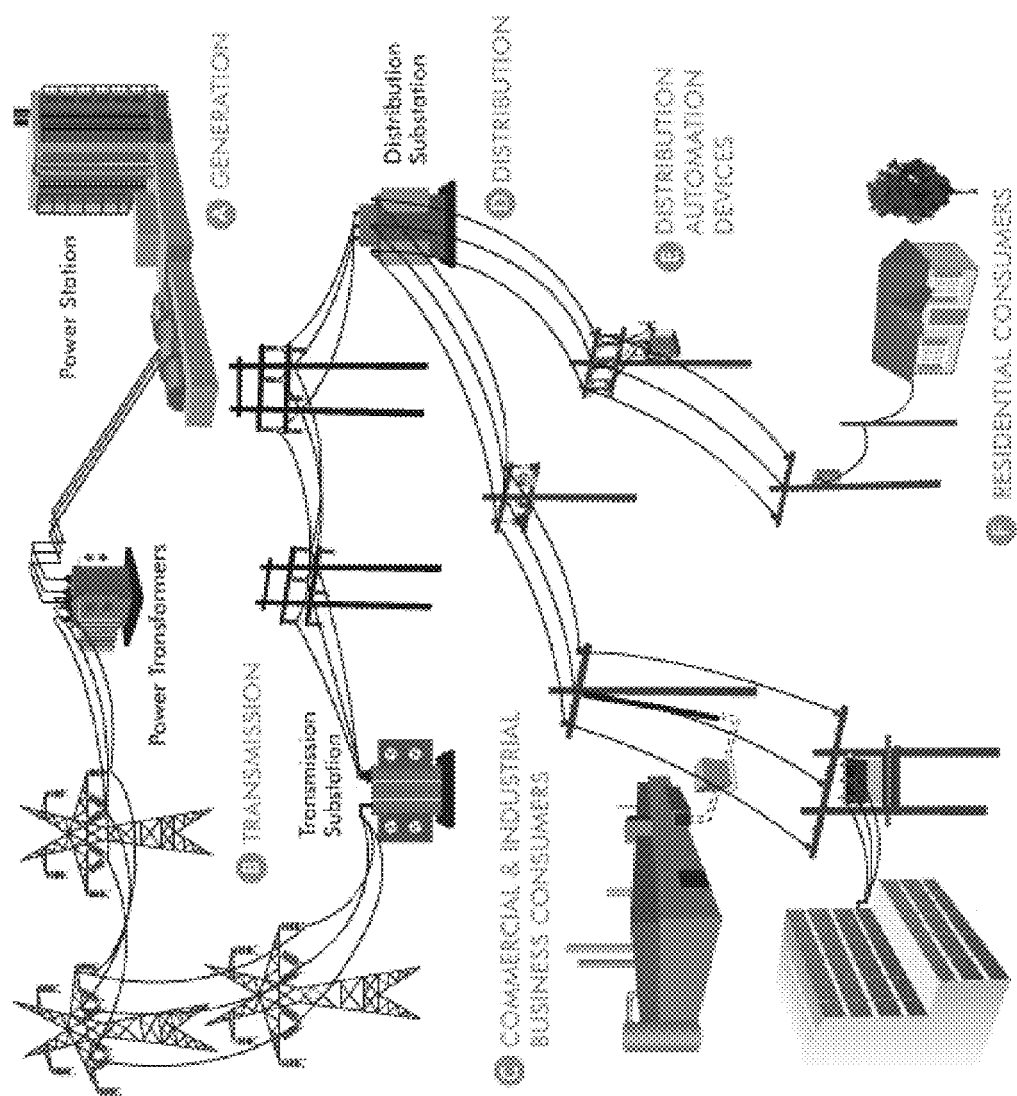
FIG. 3 is an illustration of a power line transmission infrastructure in accordance with an illustrative embodiment.

The power lines can be any suitable conductor of electricity. In an illustrative embodiment, the power lines can include utility power lines that are designed for transporting electricity. The utility power lines can include power transmission lines. FIG. 3 is an illustration of a power line transmission infrastructure in accordance with an illustrative embodiment. Widespread power line infrastructures, such as shown in FIG. 3, connect cities, critical power system elements, homes, and businesses. The infrastructure may include overhead and buried power distribution lines, transmission lines, third rail power lines, and underwater cables. In various embodiments described herein, one or more of the various power lines can be used to charge the power systems of the vehicular system 100. In alternative embodiments, any suitable source of electromagnetic fields can be used to power the systems of the vehicular system 100. For example, transmission towers such as cellular phone transmission towers can be used to power the systems of the vehicular system 100.

In some embodiments, a conductor with a direct current (DC) may be used. By moving a magnetic field with respect to a coil, a current can be induced in the coil. If the magnetic field does not move with respect to the coil, a current is not induced. Thus, if a conductor has an AC current passing through the conductor, the magnetic field around the conductor is time-varying. In such an example, the coil can be stationary with respect to the coil and have a current induced in the conductor. However, if a DC current is passed through the conductor, a static magnetic field is generated about the conductor. Thus, if a coil does not move with respect to the conductor, a current is not induced in the coil. In such instances, if the coil moves with respect to the conductor, a current will be induced in the coil. Thus, in embodiments in which the power lines have DC power, the vehicle and/or the coil can move with respect to the power line. For example, the vehicle can travel along the length of the power line. In another example, the vehicle can oscillate positions, thereby moving the coil within the magnetic field.

In embodiments in which the vehicular system 100 is an aerial vehicle, the power lines can be overhead lines. In such embodiments, the vehicular system 100 can fly close enough to the overhead lines to induce sufficient current in the charging device to charge the power systems. In some embodiments, the power lines can be underground power lines. In such embodiments, the aerial vehicular system 100 can fly close to the ground. In such embodiments, the electromagnetic field can be sufficiently strong to pass through the earth and provide sufficient power to the vehicular system 100. In an alternative embodiment, the vehicular system 100 can land above or next to the buried power lines to charge the power source. In embodiments in which the vehicular system 100 is a land-based vehicle, the operation 205 can include locating a buried power line.

In an operation 210, the vehicular system 100 can travel to the power line. For example, after identifying and/or locating the power line, the vehicular system 100 can use suitable navigation systems and propulsion devices to cause the vehicular system 100 to move sufficiently close to the power line.

Figure 4:
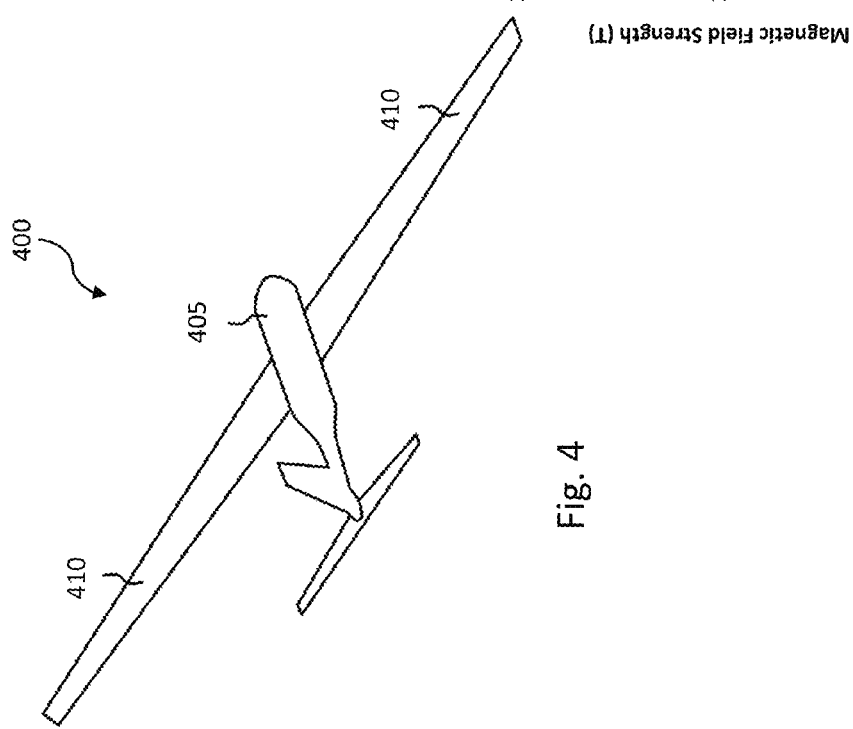
FIG. 4 is an illustration of a vehicle in accordance with an illustrative embodiment.

In an operation 215, the charging system is oriented with the power line. In an illustrative embodiment, the charging system includes one or more coils. FIG. 4 is an illustration of a vehicle in accordance with an illustrative embodiment. An illustrative unmanned aircraft system (UAS) 400 includes a fuselage 405 and wings 410. In alternative embodiments, additional, fewer, and/or different elements may be used. In an illustrative embodiment, the fuselage 405 includes a battery system. The fuselage 405 may house other components such as a computing system, electronics, sensors, cargo, etc.

In an illustrative embodiment, one or more coils of the charging system can be located in the wings 410. For example, each of the wings 410 can include a coil. The coil can be located in the wings 410 in any suitable manner. For example, the coil is located within a void within the wings 410. In another example, the coil is bonded, fused, laminated, or otherwise attached to the wings 410. In such an example, the coil can be formed within the material that makes up the wings 410 or the coil can be attached to an outside or inside surface of the wings 410. In alternative embodiments, the one or more coils can be located at any suitable location. The UAS 400 is meant to be illustrative only. In alternative embodiments, any suitable vehicle can be used and may not be a fixed wing aircraft.

Any suitable coil of a conductor can be used to induce a current that can be used to charge batteries. In an illustrative embodiment, the coil is an inductive device. For example, the coil can include a conductor coiled about a central axis. In alternative embodiments, any suitable coil can be used. For example, the coil can be wound in a spherical shape. In alternative embodiments, the charging device can include dipoles, patch antennas, etc. In an illustrative embodiment, the operation 215 includes orienting the coil to maximize the current induced in the coil. For example, the operation 215 can include orienting the coil such that the direction of the magnetic field at the coil is parallel to the central axis of the coil. In such an example, a magnetometer can be used to determine the direction of the magnetic field at the coil. For example, each of the wings 410 of the UAS 400 include a coil and a magnetometer. In an embodiment in which the vehicle is a rotary-type vehicle (e.g., a helicopter style or quad-copter style vehicle), the vehicle can orient itself in a stationary position around the power lines to orient the direction of the magnetic field with the central axis of the coil.

Figure 5:
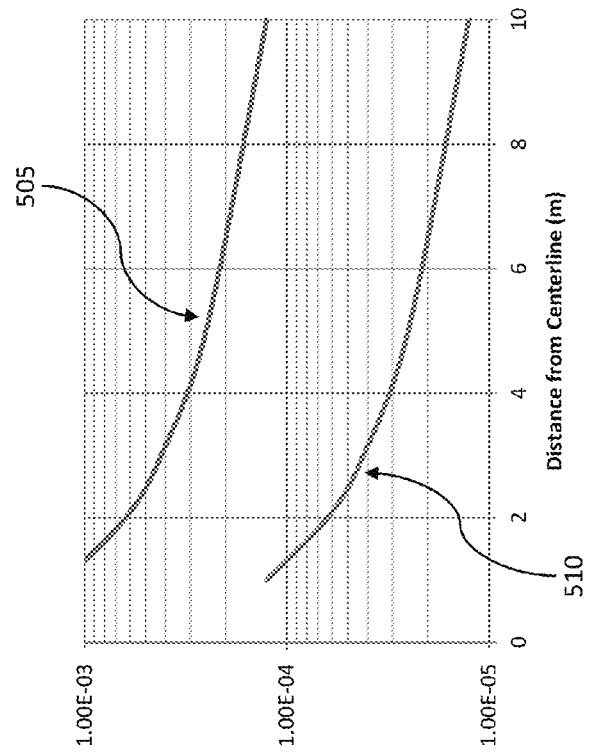
FIG. 5 is a graph of the strength of a magnetic field versus distance from the conductor in accordance with an illustrative embodiment.

In an illustrative embodiment, the operation 215 includes navigating the vehicle to get the coil as close to the power line as possible. FIG. 5 is a graph of the strength of a magnetic field versus distance from the conductor in accordance with an illustrative embodiment. Line 505 shows the strength of the magnetic field of a 1000 Ampere conductor, and line 510 shows the strength of the magnetic field of a 100 Ampere conductor. As shown in FIG. 5, the magnitude of the magnetic field decreases at a rate proportional to the inverse of the distance from the source of the magnetic field. Thus, $$B \propto \frac{1}{r}$$

where B is the magnitude of the magnetic field, and r is the distance from magnetic field source. For example, r is the distance from the power line. Thus, the closer the coil is to the power line, the more power can be induced in the coil to charge the batteries.

However, in some embodiments, practical limitations may dictate that a minimum distance be maintained between the vehicle and the power line. For example, damage can occur to the vehicle if the vehicle strikes or grazes the power line. In such an example, the vehicle may lose control or crash. In another example, the power line has high voltage and/or high current. For example, the voltage between power lines can be between five thousand to seven thousand volts and the power lines can carry about one hundred Amperes (Amps). In alternative embodiments, the power lines can have voltages above seven thousand volts or less than five thousand volts. Similarly, the power lines can have less than one hundred Amps or greater than one hundred Amps. In such an example, if the vehicle is close enough to the power lines, a static discharge may occur. Such a discharge may be a plasma discharge that can damage the vehicle.

In an illustrative embodiment, the vehicle is about one meter away from the power line. For example, one or more of the coils can be located one meter away from the power line. In alternative embodiments, the vehicle can be between one and ten meters away from the power line. In yet other embodiments, the vehicle can be between ten and twenty meters away from the power lines. In alternative embodiments, the vehicle is closer than one meter or further away than twenty meters from the power lines.

In an operation 220, the power source can be charged. For example, the power source may include one or more batteries. Current induced in the coil can be used to charge the batteries. In an illustrative embodiment, the power in the power lines can be alternating current (AC) power. In such an embodiment, the magnetic field produced by the AC power alternates, and the current induced in the coil alternates. The vehicle can include a rectifier that converts the induced current to a direct current to charge one or more of the batteries.

In an operation 225, the orientation of the charging system with the power line can be maintained. For example, the vehicle can maximize the amount of current induced in the coil while maintaining a suitable (e.g., safe) distance from the power line.

In embodiments in which the vehicle can charge while in a stationary position (e.g., a land vehicle or a rotary vehicle), the vehicle can maintain a consistent position near the power line. In embodiments in which the vehicle moves along the power line (e.g., when the vehicle is charging while traveling or if the vehicle is a fixed wing vehicle), the vehicle can follow the path of the power lines. For example, overhead power lines may sag between support poles. In such an example, the vehicle can follow the sagging (e.g., the catenary shape) of the power lines as the vehicle travels along the length of the power lines. For example, the vehicle can maintain a constant distance from the power line.

The vehicle can maintain a distance from the power lines in any suitable manner. For example, the UAS 400 can include a magnetometer in each of the wings 410. The UAS 400 can triangulate the position of the power lines using the magnetometers. For example, the direction of the magnetic field around the power lines is perpendicular to the length of the power lines (e.g., perpendicular to the direction of current travel). Thus, based on the measured direction of the magnetic field, the direction of the power line can be determined. To determine the distance from the power line, the magnitude of the magnetic field measured at each of the magnetometers can be used to triangulate the distance to the power line. In alternative embodiments, any other suitable device may be used to determine the distance from the vehicle to the power lines. For example, the vehicle can use lasers, cameras, ultrasonic sensors, focal plane arrays, or infrared sensors to detect the location of the power lines.

Figure 6:
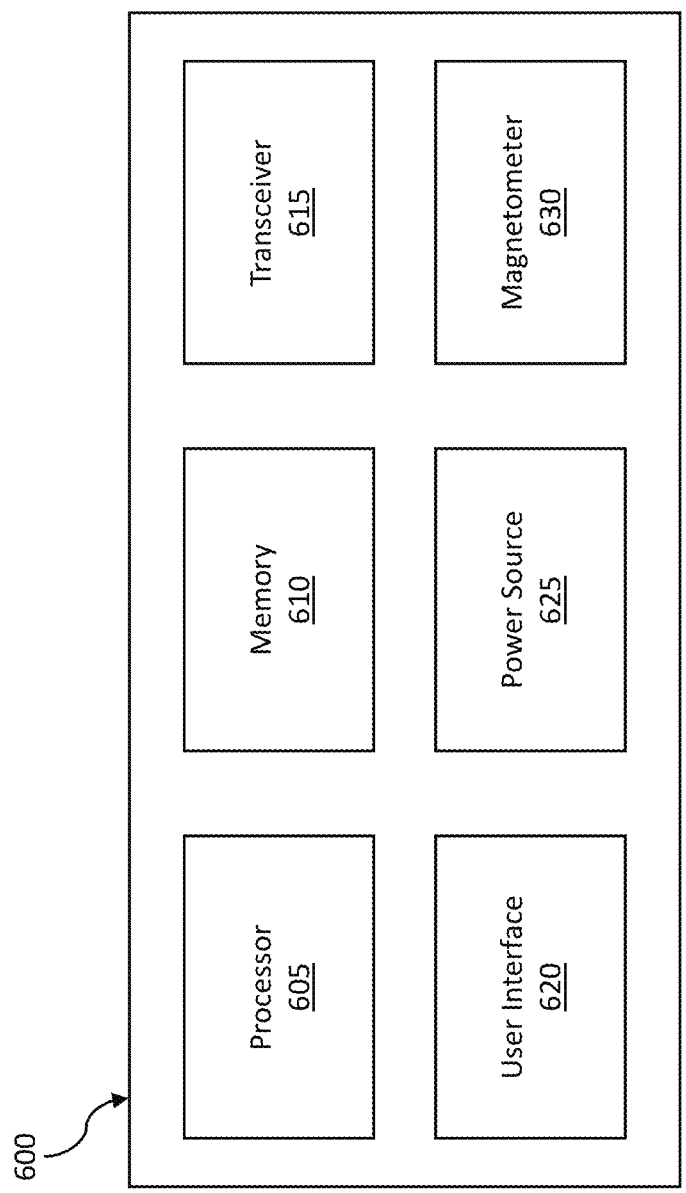
FIG. 6 is a block diagram of a computing device in accordance with an illustrative embodiment.

FIG. 6 is a block diagram of a computing device in accordance with an illustrative embodiment. An illustrative computing device 600 includes a memory 610, a processor 605, a transceiver 615, a user interface 620, a power source 625, and an magnetometer 630. In alternative embodiments, additional, fewer, and/or different elements may be used. The computing device 600 can be any suitable device described herein. For example, the computing device 600 can be a desktop computer, a laptop computer, a smartphone, a specialized computing device, etc. The computing device 600 can be used to implement one or more of the methods described herein.

In an illustrative embodiment, the memory 610 is an electronic holding place or storage for information so that the information can be accessed by the processor 605. The memory 610 can include, but is not limited to, any type of random access memory (RAM), any type of read only memory (ROM), any type of flash memory, etc. such as magnetic storage devices (e.g., hard disk, floppy disk, magnetic strips, etc.), optical disks (e.g., compact disk (CD), digital versatile disk (DVD), etc.), smart cards, flash memory devices, etc. The computing device 600 may have one or more computer-readable media that use the same or a different memory media technology. The computing device 600 may have one or more drives that support the loading of a memory medium such as a CD, a DVD, a flash memory card, etc.

In an illustrative embodiment, the processor 605 executes instructions. The instructions may be carried out by a special purpose computer, logic circuits, or hardware circuits. The processor 605 may be implemented in hardware, firmware, software, or any combination thereof. The term "execution" is, for example, the process of running an application or the carrying out of the operation called for by an instruction. The instructions may be written using one or more programming language, scripting language, assembly language, etc. The processor 605 executes an instruction, meaning that it performs the operations called for by that instruction. The processor 605 operably couples with the user interface 620, the transceiver 615, the memory 610, etc. to receive, to send, and to process information and to control the operations of the computing device 600. The processor 605 may retrieve a set of instructions from a permanent memory device such as a ROM device and copy the instructions in an executable form to a temporary memory device that is generally some form of RAM. An illustrative computing device 600 may include a plurality of processors that use the same or a different processing technology. In an illustrative embodiment, the instructions may be stored in memory 610.

In an illustrative embodiment, the transceiver 615 is configured to receive and/or transmit information. In some embodiments, the transceiver 615 communicates information via a wired connection, such as an Ethernet connection, one or more twisted pair wires, coaxial cables, fiber optic cables, etc. In some embodiments, the transceiver 615 communicates information via a wireless connection using microwaves, infrared waves, radio waves, spread spectrum technologies, satellites, etc. The transceiver 615 can be configured to communicate with another device using cellular networks, local area networks, wide area networks, the Internet, etc. In some embodiments, one or more of the elements of the computing device 600 communicate via wired or wireless communications. In some embodiments, the transceiver 615 provides an interface for presenting information from the computing device 600 to external systems, users, or memory. For example, the transceiver 615 may include an interface to a display, a printer, a speaker, etc. In an illustrative embodiment, the transceiver 615 may also include alarm/indicator lights, a network interface, a disk drive, a computer memory device, etc. In an illustrative embodiment, the transceiver 615 can receive information from external systems, users, memory, etc.

In an illustrative embodiment, the user interface 620 is configured to receive and/or provide information from/to a user. The user interface 620 can be any suitable user interface. The user interface 620 can be an interface for receiving user input and/or machine instructions for entry into the computing device 600. The user interface 620 may use various input technologies including, but not limited to, a keyboard, a stylus and/or touch screen, a mouse, a track ball, a keypad, a microphone, voice recognition, motion recognition, disk drives, remote controllers, input ports, one or more buttons, dials, joysticks, etc. to allow an external source, such as a user, to enter information into the computing device 600. The user interface 620 can be used to navigate menus, adjust options, adjust settings, adjust display, etc.

The user interface 620 can be configured to provide an interface for presenting information from the computing device 600 to external systems, users, memory, etc. For example, the user interface 620 can include an interface for a display, a printer, a speaker, alarm/indicator lights, a network interface, a disk drive, a computer memory device, etc. The user interface 620 can include a color display, a cathode-ray tube (CRT), a liquid crystal display (LCD), a plasma display, an organic light-emitting diode (OLED) display, etc.

In an illustrative embodiment, the power source 625 is configured to provide electrical power to one or more elements of the computing device 600. In some embodiments, the power source 625 includes an alternating power source, such as available line voltage (e.g., 120 Volts alternating current at 60 Hertz in the United States). The power source 625 can include one or more transformers, rectifiers, etc. to convert electrical power into power useable by the one or more elements of the computing device 600, such as 1.5 Volts, 8 Volts, 12 Volts, 24 Volts, etc. The power source 625 can include one or more batteries.

In an illustrative embodiment, the computing device 600 includes a magnetometer 630. In other embodiments, magnetometer 630 is an independent device and is not integrated into the computing device 600. The magnetometer 630 can be configured to measure magnetic fields. For example, the magnetometer 630 can be the magnetometer 125 or any suitable magnetometer. The magnetometer 630 can communicate with one or more of the other components of the computing device 600 such as the processor 605, the memory 610, etc. A signal from the magnetometer 630 can be used to determine the strength and/or direction of the magnetic field applied to the magnetometer 630.

In an illustrative embodiment, any of the operations described herein can be implemented at least in part as computer-readable instructions stored on a computer-readable memory. Upon execution of the computer-readable instructions by a processor, the computer-readable instructions can cause a node to perform the operations.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B." Further, unless otherwise noted, the use of the words "approximately," "about," "around," "substantially," etc., mean plus or minus ten percent.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A device comprising:
   a propulsion unit configured to move the device;
   a steering unit configured to control the direction of movement of the device;
   a power unit configured to provide power to the propulsion unit;
   a charging unit configured to use an electric field to provide electrical power to the power unit;
   a first magnetic sensor configured to determine a vector of one or more magnetic fields; and a processor communicatively coupled to the propulsion unit, the steering unit, the power unit, and the magnetic sensor, wherein the processor is configured to:
receive, from the magnetic sensor, a time-varying signal indicative of a magnetic field;
determine, based on the time-varying signal, that the magnetic field is associated with an electrical power transmission line;
determine, based on the time-varying signal, a distance between the electrical power transmission line and the device;
compare the distance between the electrical power transmission line and the device and a first distance; and
cause the steering unit to direct the device toward the electrical power transmission line based on the comparison to the first distance away from the electrical power transmission line.

2. The device of claim 1, wherein the electric field is generated by the electrical power transmission line.

3. The device of claim 1, wherein the processor is further configured to cause the steering unit to orient the device in a direction that maximizes the electrical power provided to the power unit.

4. The device of claim 3, wherein to determine the distance between the electrical power transmission line and the device, the processor is configured to:
cause the steering unit to move in a direction that is not parallel to a length of the electrical power transmission line; and
determine, based on an indication that the magnetic field increased and then decreased, that the device traveled through a plane parallel to the length of the electrical power transmission line.

5. The device of claim 3, wherein the first distance is one meter.

6. The device of claim 1, wherein the charging unit comprises an inductive transducer.

7. The device of claim 6, wherein the inductive transducer comprises an inductive coil.

8. The device of claim 1, wherein the propulsion unit includes one or more propellers.

9. The device of claim 1, wherein the propulsion unit is configured to move the device in three dimensions.

10. The device of claim 1, further comprising:
a fuselage configured to contain the power unit; and
a first wing extending from the fuselage, wherein the first wing comprises a first inductive transducer, and wherein the charging unit uses the first inductive transducer to provide the electrical power to the power unit.

11. The device of claim 10, wherein the first wing further comprises the first magnetic sensor.

12. The device of claim 10, further comprising a second wing extending from the fuselage, wherein the second wing comprises a second inductive transducer, and wherein the charging unit uses the second inductive transducer to provide the electrical power to the power unit.

13. The device of claim 12, further comprising a second magnetic sensor, wherein the second wing further comprises the second magnetic sensor.

14. The device of claim 1, further comprising a power meter configured to monitor a power level of the power unit, wherein the processor is communicatively coupled to the power meter, and wherein the processor is configured to cause the steering unit to direct the device toward the electrical power transmission line in response to receiving an indication from the power meter that the power level of the power unit is below a power threshold.

15. The device of claim 1, further comprising memory configured to store a magnetic waypoint database.

16. The device of claim 1, wherein the first magnetic sensor comprises a diamond with a nitrogen vacancy.

17. The device of claim 1, wherein the electrical power transmission line comprises an overhead electrical power transmission line.

18. The device of claim 1, wherein the electrical power transmission line comprises a buried electrical power transmission line.

19. The device of claim 1, wherein the electrical power transmission line is a utility power line.

20. The device of claim 1, wherein the electrical power transmission line transmits high voltage.

21. A method comprising:
receiving, at a processor, a time-varying signal from a first magnetic sensor, wherein the time-varying signal is indicative of a magnetic field;
determining, based on the time-varying signal, that the magnetic field is caused by an electrical power transmission line; and
causing a steering unit of a device to direct the device toward the electrical power transmission line.

22. The method of claim 21, further comprising charging a power unit of the device by using an electromagnetic field generated by the electrical power transmission line.

23. The method of claim 22, further comprising causing the steering unit of the device to maintain a first distance from the electrical power transmission line.

24. The method of claim 23, further comprising causing a propulsion unit of the device to move the device along a length of the electrical power transmission line while the device is maintained at the first distance away from the electrical power transmission line.

25. The method of claim 22, further comprising causing the steering unit to orient the device in a direction that maximizes electrical power used in charging to the power unit.

26. The method of claim 21, further comprising:
determining, based on the time-varying signal, a distance between the electrical power transmission line and the device;
comparing the distance between the electrical power transmission line and the device and a first distance; and
causing the steering unit to direct the device based on the comparison to be the first distance away from the electrical power transmission line.

27. The method of claim 26, wherein determining the distance between the electrical power transmission line and the device comprises:
causing the steering unit to move in a direction that is not parallel to a length of the electrical power transmission line; and
determining, based on an indication that the magnetic field increased and then decreased, that the device traveled through a plane parallel to the length of the electrical power transmission line.

28. The method of claim 26, wherein the first distance is less than ten meters.

29. The method of claim 21, wherein to direct the device to the electrical power transmission line, the method includes directing the device in three dimensions.

30. The method of claim 21, further comprising determining, via a power meter, that the power unit is below a power threshold, wherein said causing the steering unit to direct the device toward the electrical power transmission line is in response to said determining that the power level of the power unit is below the power threshold.

31. A device comprising:
  a propulsion unit configured to move the device;
  a power unit configured to provide power to the propulsion unit;
  a charging unit configured to use an electric field to provide electrical power to the power unit;
  a first magnetic sensor configured to determine a vector of a magnetic field of an electrical power transmission line; and
  a transceiver configured to transmit to a receiver the vector of the magnetic field.

32. The device of claim 31, further comprising a steering unit configured to control the direction that the device moves in.

33. The device of claim 32, wherein the transceiver is further configured to receive instructions for the steering unit.

34. A system comprising:
  a vehicle comprising:
    a propulsion unit configured to move the vehicle;
    a power unit configured to provide power to the propulsion unit;
    a charging unit configured to use an electric field to provide electrical power to the power unit;
    a first magnetic sensor configured to determine a vector of a magnetic field of an electrical power transmission line; and
    a transceiver configured to transmit a signal indicating the vector of the magnetic field; and
  a transceiver unit configured receive the signal.

35. The system of claim 34, wherein the transceiver unit further comprises a display configured to display the vector of the magnetic field.

36. The system of claim 34, wherein the transceiver unit is further configured to transmit a signal indicating a change in direction, wherein the transceiver is configured to receive the signal indicating the change in direction, and wherein the propulsion unit is configured to move the vehicle based on the change in direction.

37. A device comprising:
  a propulsion unit configured to move the device;
  a first magnetic sensor configured to determine a first vector of a magnetic field;
  a power unit configured to provide power to the propulsion unit; and
  a charging unit configured to use an electric field to provide electrical power to the power unit, wherein the electric field and the magnetic field are associated with an electrical power transmission line.

38. The device of claim 37, further comprising a processor operatively coupled to the propulsion unit and the first magnetic sensor, wherein the processor is configured to cause the propulsion unit to maintain a first distance from the electrical power transmission line based at least in part on a direction of the first vector of the magnetic field.

39. The device of claim 38, further comprising a second magnetic sensor configured to determine a second vector of the magnetic field, wherein the processor is operatively coupled to the second magnetic sensor, and wherein the processor is further configured to determine a distance between the device and the electrical power transmission line based on the first vector of the magnetic field and the second vector of the magnetic field.

40. The device of claim 37, wherein the vector of the one or more magnetic fields comprises a magnitude and a direction of the one or more magnetic fields.

* * * * *